United States Patent
Mattausch et al.

(10) Patent No.: US 7,860,328 B2
(45) Date of Patent: Dec. 28, 2010

(54) COMPRESSION PROCESSING APPARATUS AND COMPRESSION PROCESSING METHOD

(75) Inventors: Hans Juergen Mattausch, Higashihiroshima (JP); Tetsushi Koide, Higashihiroshima (JP); Takeshi Kumaki, Higashihiroshima (JP); Masakatsu Ishizaki, Higashihiroshima (JP)

(73) Assignee: Hiroshima University, Higashihiroshima-shi, Hiroshima (JP)

( * ) Notice: Subject to any disclaimer, the term of this patent is extended or adjusted under 35 U.S.C. 154(b) by 0 days.

(21) Appl. No.: 12/664,946

(22) PCT Filed: Jul. 31, 2008

(86) PCT No.: PCT/JP2008/002065
§ 371 (c)(1),
(2), (4) Date: Dec. 16, 2009

(87) PCT Pub. No.: WO2010/013290
PCT Pub. Date: Feb. 4, 2010

(65) Prior Publication Data
US 2010/0189351 A1 Jul. 29, 2010

(51) Int. Cl.
*G06K 9/46* (2006.01)
(52) U.S. Cl. .................................... 382/246
(58) Field of Classification Search ................ 382/232, 382/246, 239
See application file for complete search history.

(56) References Cited

U.S. PATENT DOCUMENTS 5,253,078 A * 10/1993 Balkanski et al. ............ 382/250
2002/0106130 A1* 8/2002 Yokonuma ................... 382/232

FOREIGN PATENT DOCUMENTS

| JP | 06-237448 | 8/1994 |
| JP | 2005-012495 | 1/2005 |
| JP | 2006-217145 | 8/2006 |

OTHER PUBLICATIONS

Huffman, D.A., "A Method for Construction of Minimum-Redundancy Codes," Proceedings of the I.R.E., No. 40, pp. 1098-1101, Sep. 1952.
Knuth, D.E., "Dynamic Huffman Coding," Journal of Algorithms vol. 6, pp. 163-180, 1985.
Wang, D.L. et al., "Image Segmentation Based on Oscillatory Correlation," Neural Computation, vol. 9, pp. 1-30, 1997.
Jähne, B., "Digital Image Processing," Springer-Verlag, pp. 427-440, 2001.

(Continued)

*Primary Examiner*—Vu Le
*Assistant Examiner*—Claire Wang
(74) *Attorney, Agent, or Firm*—Foley & Lardner LLP

(57) ABSTRACT

A dividing unit divides respective symbol sequences of input data applied with zigzag scan and a run-length process into a plurality of subsets having similar frequencies of occurrence, depending on a difference in frequencies of occurrence. A table creating unit scans each subset and creates a Huffman coding table for each subset. A coding unit executes a process for performing Huffman coding on each subset by using the Huffman coding table created for the subset, for all of the subsets in the plurality of subsets.

10 Claims, 18 Drawing Sheets

OTHER PUBLICATIONS

Russ, J.C., "The Image Processing Handbook," CRC Press, pp. 371-429, 1999.

Bräunl, T. et al., "Parallel Image Processing," Springer-Verlag, pp. 59-63, 2000.

Ma, W.Y. et al., "EdgeFlow: A Technique for Boundary Detection Image Segmentation," IEEE Transactions on Image Processing, vol. 9, No. 8, pp. 1375-1388, Aug. 2000.

International Search Report for PCT/JP2008/002065, mailed Nov. 4, 2008.

* cited by examiner ated at the
COMPRESSION PROCESSING APPARATUS AND COMPRESSION PROCESSING METHOD

CROSS-REFERENCE TO RELATED APPLICATIONS

The present application is a U.S. national stage application claiming the benefit of International Application No. PCT/JP2008/002065, filed on Jul. 31, 2008, the entire contents of which is incorporated herein by reference in its entirety.

TECHNICAL FIELD

The present invention relates to a compression processing apparatus and a compression processing method which compress data.

BACKGROUND ART

Conventionally, Huffman coding is known as one of the most efficient reversible compression techniques in data compression techniques (D. A. Huffman, "A method for the construction of minimum redundancy codes," Proc. IRE, no. 40, pp. 1098-1101, September 1952).

General Huffman coding first creates a coding table suitable for target data by carefully examining all coding target symbol sequences before performing a compression process, and performs the compression process by using the created coding table again for similar symbol sequences.

However, since this method needs to scan the data twice for performing the compression, online real time compression becomes difficult. Moreover, if there are many types of the coding target symbol sequences and there is a bias in frequencies of occurrence thereof, improvement of a compression ratio may not be expected.

The Huffman coding has, therefore, been classified into two kinds recently: static Huffman coding and dynamic (also referred to as "adaptive") Huffman coding (D. E. Kunth, "Dynamic Huffman coding," J. Algorithms, vol. 6, pp. 163-180, 1985).

The static Huffman coding is the most common form of implementation in both software and hardware. In addition, in order to execute a coding process in real time, the static Huffman coding previously examines frequencies of occurrence of data from a large number of pieces of sample data, prepares an existing table created based on a result thereof, and performs the coding.

The dynamic Huffman coding has been developed in order to improve the online compression which has been a challenge in the conventional Huffman coding, and compression suitable for arbitrary symbol sequences without an existing table, which has been a challenge in the static Huffman coding. The dynamic Huffman coding updates a Huffman tree each time a symbol is processed, and performs the coding by using the tree composed at that time point.

DISCLOSURE OF THE INVENTION

In the conventional dynamic Huffman coding, however, there are several problems in compression efficiency and a real time property. Specifically, the dynamic Huffman coding needs to transmit first-occurring symbols which are not coded, along with coded data, due to the nature of its algorithm, which increases a data amount thereof.

Moreover, in the dynamic Huffman coding, since the Huffman tree does not grow sufficiently for a certain period from the beginning of the compression, the compression ratio is often low. The same also applies to a case where a data occurrence distribution is changed during the compression.

Furthermore, due to data locality, if a short code has been assigned to a symbol which has occurred in a concentrated manner and the symbol does not occur subsequently, the compression efficiency may be even lower than the static Huffman coding as the data amount becomes large.

To solve this, the coding table may be periodically refreshed; however, discarding a data occurrence probability in the past also adversely leads to degraded compression efficiency. Moreover, since the Huffman tree is updated at the time of each coding, the process requires a longer time. Consequently, even though online processing is possible, the dynamic Huffman coding may not be suitable for applications requiring the real time property.

It is, therefore, desired to provide a compression processing apparatus which can improve the compression efficiency. Moreover, it is desired to provide a compression processing method which can improve the compression efficiency.

The compression processing apparatus is a compression processing apparatus compressing input data and outputting compressed data, and is provided with a dividing unit and a coding unit. The dividing unit divides a plurality of elements included in a population having the input data into a plurality of subsets by using a feature of each element. The coding unit performs Huffman coding on coding target data for each subset by using a plurality of Huffman coding tables provided corresponding to the plurality of subsets, and outputs the compressed data.

The compression processing apparatus may be further provided with a table creating unit. The table creating unit creates the plurality of Huffman coding tables by executing, for all of the plurality of subsets, a process for examining a frequency of occurrence of the coding target data included in one subset and creating the Huffman coding table corresponding to the one subset.

The coding unit may perform the Huffman coding on the coding target data for each subset while creating the plurality of Huffman coding tables.

The compression processing apparatus may be further provided with a table retaining unit and an updating unit. The table retaining unit retains first and second coding tables each consisting of a plurality of Huffman codes. The updating unit updates one coding table which is not used for the Huffman coding on the input data, in the first and second coding tables, depending on a frequency of occurrence of the coding target data so that the coding target data with a highest frequency of occurrence is converted into a shortest Huffman code. In addition, when a compression ratio of the compressed data is equal to or less than a threshold, the coding unit may perform the Huffman coding on the coding target data for each subset while creating the plurality of Huffman coding tables, based on the other coding table in the first and second coding tables, and when the compression ratio becomes larger than the threshold, the coding unit may perform the Huffman coding on the coding target data for each subset while creating the plurality of Huffman coding tables, based on the one coding table updated by the updating unit.

The updating unit may update the one coding table by counting the frequency of occurrence for all of the coding target data, executing a process for, each time the frequency of occurrence for one of the coding target data reaches a maximum value, assigning a new Huffman code having a shorter length to the one of the coding target data for which the frequency of occurrence has reached the maximum value earlier in order thereof, for all of the coding target data.

The updating unit may calculate the compression ratio based on the compressed data outputted from the coding unit, and, when the calculated compression ratio has become larger than the threshold, or when the new Huffman code has been assigned to all of the coding target data, the updating unit may generate an exchanging signal for exchanging the coding table and output the exchanging signal to the coding unit. The coding unit may exchange the coding table in response to the exchanging signal, and perform the Huffman coding on the coding target data for each subset while creating the plurality of Huffman coding tables, based on the exchanged coding table.

The compression processing apparatus may be further provided with an image segmenting unit. The image segmenting unit segments an image into a plurality of images based on target objects included in the image and generates a plurality of input data. In addition, the dividing unit executes a process for dividing a plurality of elements included in a population having one of input data in the plurality of input data, into a plurality of subsets by using a feature of each element, for all of the plurality of input data. The coding unit may execute a process for performing the Huffman coding on coding target data for each subset by using a plurality of Huffman coding tables provided corresponding to the plurality of subsets divided from the one of input data, and outputting the compressed data, for all of the plurality of input data.

Moreover, the compression processing method is a compression processing method compressing input data and outputting compressed data, and is provided with a first step of a dividing unit dividing a plurality of elements included in a population having the input data into a plurality of subsets by using a feature of each element; and a second step of a coding unit performing Huffman coding on coding target data for each subset by using a plurality of Huffman coding tables provided corresponding to the plurality of subsets, and outputting the compressed data.

The compression processing method may be further provided with a third step of a table creating unit creating the plurality of Huffman coding tables by executing, for all of the plurality of subsets, a process for examining a frequency of occurrence of the coding target data included in one subset and creating the Huffman coding table corresponding to the one subset.

In the second step, the coding unit may perform the Huffman coding on the coding target data for each subset while creating the plurality of Huffman coding tables.

The compression processing method is further provided with a third step of an updating unit updating one coding table which is not used for the Huffman coding on the input data, in first and second coding tables each having a plurality of Huffman codes, depending on a frequency of occurrence of the coding target data so that the coding target data with a highest frequency of occurrence is converted into a shortest Huffman code, and in the second step, when a compression ratio of the compressed data is equal to or less than a threshold, the coding unit may perform the Huffman coding on the coding target data for each subset while creating the plurality of Huffman coding tables, based on the other coding table in the first and second coding tables, and when the compression ratio becomes larger than the threshold, the coding unit may perform the Huffman coding on the coding target data for each subset while creating the plurality of Huffman coding tables, based on the one coding table.

The third step may include a first substep of the updating unit counting the frequency of occurrence for all of the coding target data; and a second substep of the updating unit updating the one coding table by executing a process for, each time the frequency of occurrence for one of the coding target data reaches a maximum value, assigning a new Huffman code having a shorter length to the one of the coding target data for which the frequency of occurrence has reached the maximum value earlier in order thereof, for all of the coding target data.

The third step further includes a third substep of the updating unit calculating the compression ratio based on the compressed data outputted from the coding unit; and a fourth substep of, when the compression ratio calculated in the third substep has become larger than the threshold, or when the new Huffman code has been assigned to all of the coding target data, the updating unit generating an exchanging signal for exchanging the coding table and outputting the exchanging signal to the coding unit, and in the second step, the coding unit may exchange the coding table in response to the exchanging signal, and perform the Huffman coding on the coding target data for each subset while creating the plurality of Huffman coding tables, based on the exchanged coding table.

The compression processing method is further provided with a third step of an image segmenting unit segmenting an image into a plurality of images based on target objects included in the image and generating a plurality of input data, and in the first step, the dividing unit may execute a process for dividing a plurality of elements included in a population having one of input data in the plurality of input data, into a plurality of subsets by using a feature of each element, for all of the plurality of input data, and in the second step, the coding unit may execute a process for performing the Huffman coding on coding target data for each subset by using a plurality of Huffman coding tables provided corresponding to the plurality of subsets divided from the one of input data, and outputting the compressed data, for all of the plurality of input data.

The compression processing apparatus or the compression processing method divides the input data into the plurality of subsets depending on a difference in frequencies of occurrence of respective symbol sequences, creates the Huffman coding table for each subset in the divided plurality of subsets, and performs the Huffman coding for each subset by using the created Huffman coding table.

As a result, a shorter Huffman code is assigned to the coding target data included in each subset, than a case of using the conventional Huffman coding.

Therefore, the compression ratio can be improved.

BEST MODE FOR CARRYING OUT THE INVENTION

Figure 1:
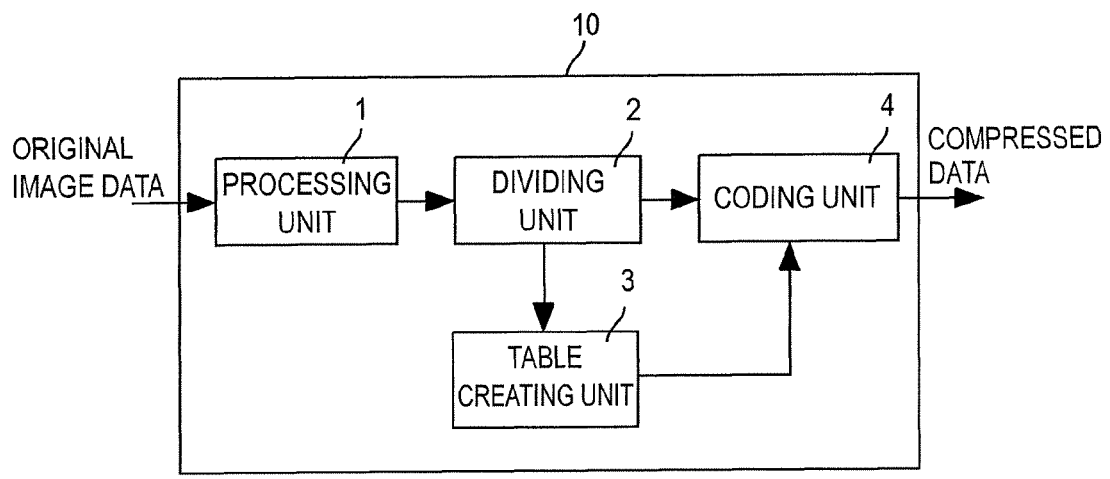
FIG. 1 is a schematic block diagram showing a configuration of a compression processing apparatus according to Embodiment 1 of the present invention.

Embodiments of the present invention will be described in detail with reference to the drawings. It should be noted that the same or equivalent portions in the drawings are assigned with the same reference characters and descriptions thereof are not repeated.

Embodiment 1

FIG. 1 is a schematic block diagram showing a configuration of a compression processing apparatus according to Embodiment 1 of the present invention. With reference to FIG. 1, a compression processing apparatus 10 according to Embodiment 1 of the present invention comprises a processing unit 1, a dividing unit 2, a table creating unit 3 and a coding unit 4.

The processing unit 1 performs segmentation into a plurality of pixels, RGB to YCbCr conversion/sampling, level shift, discrete cosine transform, quantization, and a zigzag scan/run-length process, on an original image, in a compression method using conventional Huffman codes. In addition, the processing unit 1 outputs data applied with the zigzag scan and the run-length process to the dividing unit 2 as input data.

The dividing unit 2 divides the input data received from the processing unit 1 into a plurality of subsets depending on a feature (frequency of occurrence) of each element included in the input data, and outputs the divided plurality of subsets to the table creating unit 3 and the coding unit 4.

The table creating unit 3 receives the plurality of subsets from the dividing unit 2. In addition, the table creating unit 3 examines the frequency of occurrence of coding target data included in one subset, and based on the examined frequency of occurrence, creates a Huffman coding table for one subset by using a conventional Huffman tree construction method. The table creating unit 3 executes this process for all the subsets in the plurality of subsets, and creates a plurality of the Huffman coding tables for the plurality of subsets. Then, the table creating unit 3 outputs the created plurality of Huffman coding tables to the coding unit 4.

The coding unit 4 receives the plurality of subsets from the dividing unit 2, and receives the plurality of Huffman coding tables from the table creating unit 3. In addition, the coding unit 4 performs Huffman coding on the coding target data included in the plurality of subsets by using the plurality of Huffman coding tables, and outputs compressed data. In this case, the coding unit 4 performs the Huffman coding on the coding target data included in one subset by using the Huffman coding table created corresponding to one subset. In addition, the coding unit 4 executes this process for all the subsets in the plurality of subsets, and performs the Huffman coding on all of the coding target data included in the plurality of subsets.

Figure 2:
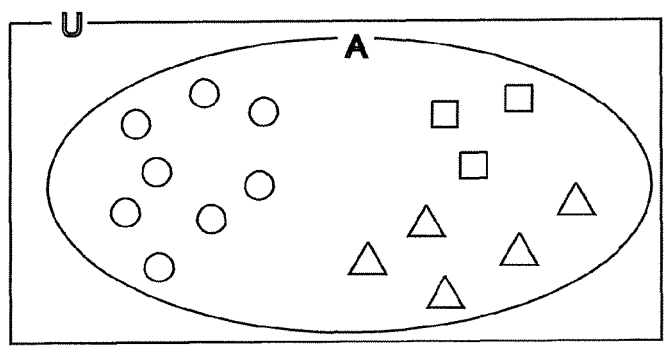
FIG. 2 is a conceptual diagram showing conventional Huffman coding.
Figure 3:
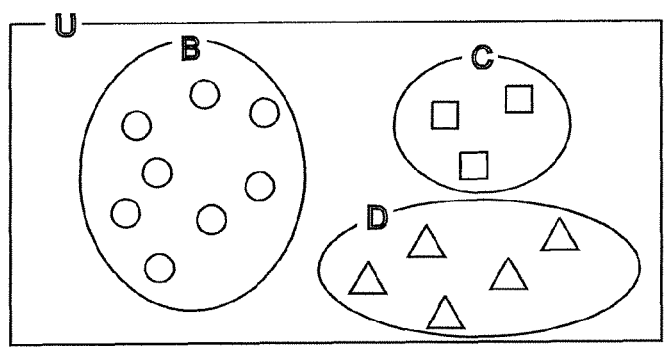
FIG. 3 is a conceptual diagram showing Huffman coding in the compression processing apparatus shown in FIG. 1.

FIG. 2 is a conceptual diagram showing conventional Huffman coding. Moreover, FIG. 3 is a conceptual diagram showing the Huffman coding in the compression processing apparatus 10 shown in FIG. 1. With reference to FIG. 2, a population U consisting of the input data consists of a plurality of elements represented by white circles, white squares and white triangles, and all of the plurality of elements belong to a subset A.

Therefore, in the conventional Huffman coding, since one Huffman coding table is created for the subset A, if the number of the elements is large and there are many types thereof, it requires time to create the Huffman coding table, and it also becomes difficult to improve compression efficiency.

On the other hand, as shown in FIG. 3, in the Huffman coding according to the present invention, the plurality of elements belonging to the population U are divided into their respective features and divided into several subsets B, C and D. In addition, the Huffman coding table is created for each of the subsets B, C and D, and the created Huffman coding table is used to perform the Huffman coding for each of the subsets B, C and D.

In this way, in the Huffman coding according to the present invention, since the Huffman coding is performed for each subset, a compression ratio can be improved. Moreover, since the Huffman coding table is created for each subset and a compression process is performed for each subset, even if the number of the elements is large, coded data can be immediately obtained.

Figure 4:
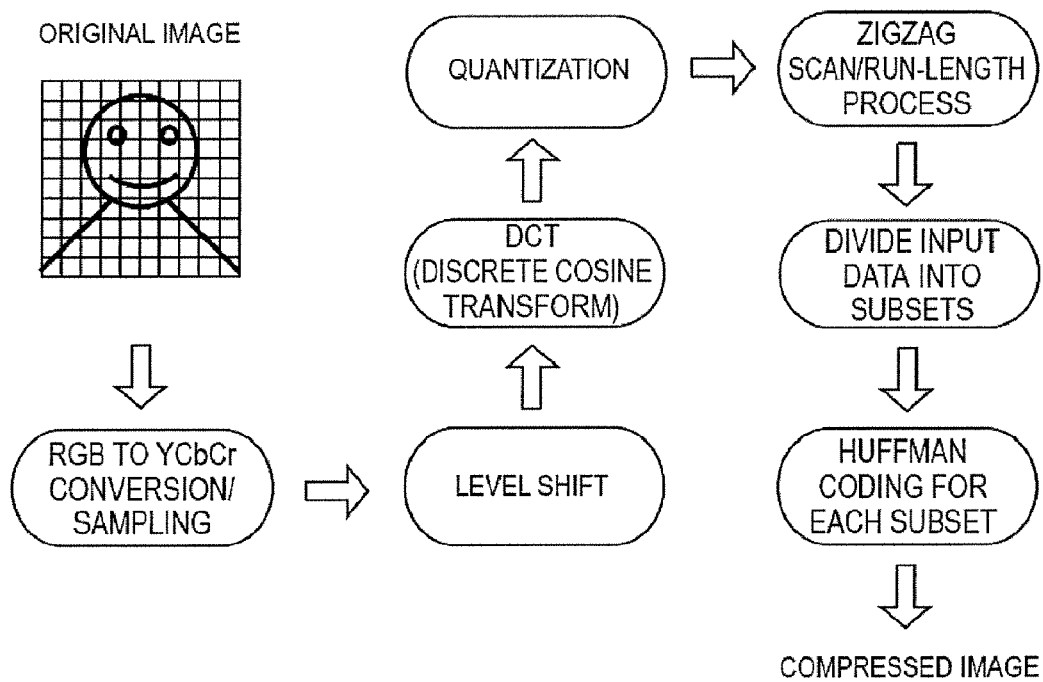
FIG. 4 is a conceptual diagram of image compression in the compression processing apparatus shown in FIG. 1.

FIG. 4 is a conceptual diagram of image compression in the compression processing apparatus 10 shown in FIG. 1. With reference to FIG. 4, if an image is compressed, the processing unit 1 in the compression processing apparatus 10 segments an original image into a plurality of elements, and performs the RGB to YCbCr conversion and the sampling on each of the segmented plurality of elements.

Then, the processing unit 1 in the compression processing apparatus 10 performs the level shift of a result of the sampling, and then performs the discrete cosine transform (DCT).

Subsequently, the processing unit 1 in the compression processing apparatus 10 performs the quantization, zigzag-scans the quantized data from top left toward bottom right in the original image, and also performs the run-length process.

Then, the dividing unit 2 in the compression processing apparatus 10 divides the input data (which means "the data applied with the zigzag scan and the run-length process", and the same applies to the followings) into the plurality of subsets, and the table creating unit 3 creates the Huffman coding table for each of the plurality of subsets divided by the dividing unit 2, and the coding unit 4 performs the Huffman coding for each subset by using the plurality of Huffman coding tables created by the table creating unit 3, and outputs the compressed image.

Therefore, a block of "DIVIDE INPUT DATA INTO SUBSETS" and a block of "HUFFMAN CODING FOR EACH SUBSET" are points different from a conventional image compression method.

Here, a method of dividing the input data into the plurality of subsets in the dividing unit 2 of the compression processing apparatus 10 will be described. For example, if the input data consists of a symbol sequence of "ATAACCCCGG", the dividing unit 2 divides the symbol sequence of "ATAACCCGG" into a symbol sequence of "ATAA" and a symbol sequence of "CCCCGG", depending on a difference in frequencies of occurrence of respective symbols.

In the data after the zigzag scan and the run-length process have been performed, portions in which similar symbol sequences such as the symbol sequence of "ATAA" and the symbol sequence of "CCCCGG" have been arranged are arranged in a distributed manner. Therefore, with reference to the symbol sequences after the zigzag scan and the run-length process have been performed, the dividing unit 2 gathers the similar symbol sequences together and divides the input data into the plurality of subsets.

In this way, the dividing unit 2 divides the data applied with the zigzag scan and the run-length process into the plurality of subsets, depending on a difference in the frequencies of occurrence of respective symbol sequences.

Figure 5:
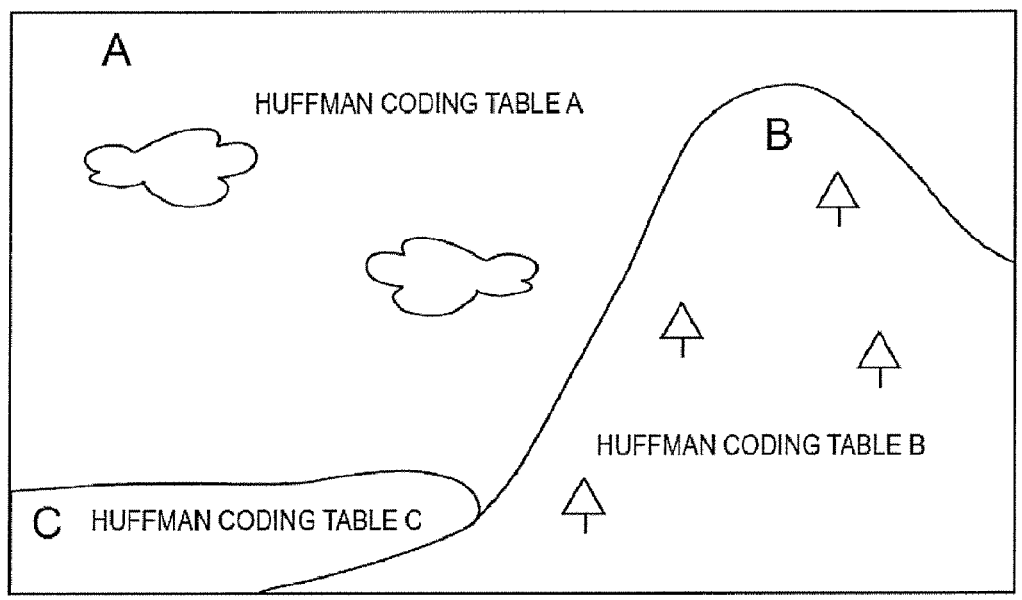
FIG. 5 is a diagram for explaining a specific example of division into subsets.

FIG. 5 is a diagram for explaining a specific example of the division into the subsets. With reference to FIG. 5, the original image is a landscape picture consisting of a sky portion, a mountain portion and a ground portion. In such the original image, the frequencies of occurrence of the respective symbol sequences are different in the sky portion, the mountain portion and the ground portion. Therefore, depending on the difference in the frequencies of occurrence of the respective symbol sequences, the dividing unit 2 divides data of the original image into a subset A consisting of the sky portion, a subset B consisting of the mountain portion, and a subset C consisting of the ground portion.

In addition, the table creating unit 3 scans the subset A consisting of the sky portion to create a Huffman coding table A for the subset A, scans the subset B consisting of the mountain portion to create a Huffman coding table B for the subset B, and scans the subset C consisting of the ground portion to create a Huffman coding table C for the subset C.

Then, the coding unit 4 performs the Huffman coding on the coding target data included in the subset A consisting of the sky portion by using the Huffman coding table A, performs the Huffman coding on the coding target data included in the subset B consisting of the mountain portion by using the Huffman coding table B, and performs the Huffman coding on the coding target data included in the subset C consisting of the ground portion by using the Huffman coding table C.

In the conventional Huffman coding, regardless of a difference in the data such as the sky portion, the mountain portion and the ground portion, the Huffman coding has been performed by using a previously defined Huffman coding table. Alternatively, in the conventional Huffman coding, the Huffman coding has been performed by using the Huffman coding table created after the entire image has been scanned.

However, according to these methods, a bit length of a Huffman code to be assigned becomes gradually longer as types of the data included in a figure are increased, and a size of the compressed data tends to be increased.

In contrast to this, in a method according to the present invention, since the Huffman coding is performed by using each of the Huffman coding tables A, B and C optimized for each of the sky, the mountain and the ground, optimal Huffman codes with a short bit length can be assigned for each subset of the image. Therefore, the compression ratio can be improved.

Figure 6:
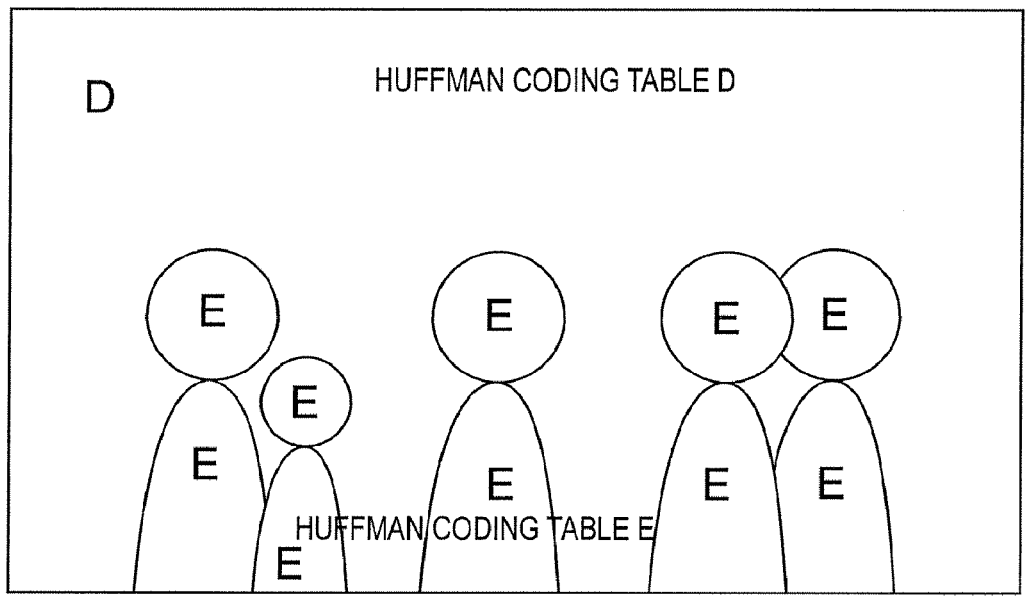
FIG. 6 is a diagram for explaining another specific example of the division into the subsets.

FIG. 6 is a diagram for explaining another specific example of the division into the subsets. With reference to FIG. 6, the original image is a snapshot of people consisting of a background portion and a people portion. In such the original image, the frequencies of occurrence of the respective symbol sequences are different in the background portion and the people portion. Therefore, depending on the difference in the frequencies of occurrence of the respective symbol sequences, the dividing unit 2 divides the data of the original image into a subset D consisting of the background portion, and a subset E consisting of the people portion.

In addition, the table creating unit 3 scans the subset D consisting of the background portion to create a Huffman coding table D for the subset D, and scans the subset E consisting of the people portion to create a Huffman coding table E for the subset E.

Then, the coding unit 4 performs the Huffman coding on the coding target data included in the subset D consisting of the background portion by using the Huffman coding table D, and performs the Huffman coding on the coding target data included in the subset E consisting of the people portion by using the Huffman coding table E.

Also in this case, in the method according to the present invention, the compression ratio can be improved more than the conventional Huffman coding due to the same reason as the above described reason.

Figure 7:
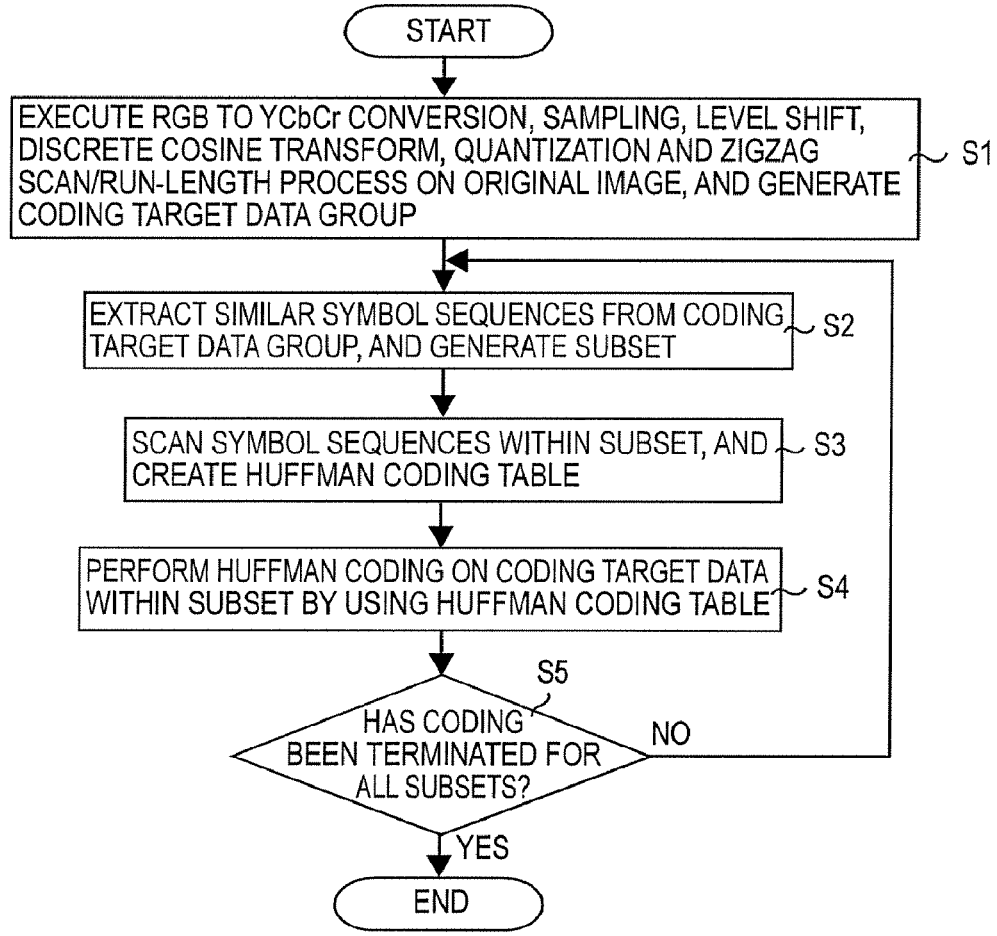
FIG. 7 is a flowchart for explaining a compression processing method in Embodiment 1.

FIG. 7 is a flowchart for explaining a compression processing method in Embodiment 1. With reference to FIG. 7, when a series of operations are started, the processing unit 1 in the compression processing apparatus 10 executes the RGB to YCbCr conversion, the sampling, the level shift, the discrete cosine transform, the quantization and the zigzag scan/run-length process on the original image, and generates a coding target data group (=the input data) (step S1).

In addition, the dividing unit 2 extracts the similar symbol sequences from the coding target data group received from the processing unit 1, and generates the subset (step S2).

Then, the table creating unit 3 scans within the subset generated by the dividing unit 2, and creates the Huffman coding table (step S3).

Subsequently, the coding unit 4 receives the subset from the dividing unit 2, and receives the Huffman coding table from the table creating unit 3. In addition, the coding unit 4 performs the Huffman coding on the coding target data within the subset by using the Huffman coding table (step S4).

Then, it is determined whether or not the Huffman coding has been terminated for all the subsets (step S5), and if the Huffman coding has not been terminated for all the subsets, the series of operations return to step S2, and the above described steps S2 to S5 are repeatedly executed.

In addition, in step S5, if it is determined that the Huffman coding has been terminated for all the subsets, the series of operations are terminated.

As described above, according to Embodiment 1, the compression processing apparatus 10 divides the input data into the plurality of subsets depending on the difference in the frequencies of occurrence of the respective symbol sequences, creates the Huffman coding table for each subset in the divided plurality of subsets, and performs the Huffman coding for each subset by using the created Huffman coding table.

As a result, a shorter Huffman code is assigned to the coding target data included in each subset, than a case of using the conventional Huffman coding. Therefore, the compression ratio can be improved.

Embodiment 2

Figure 8:
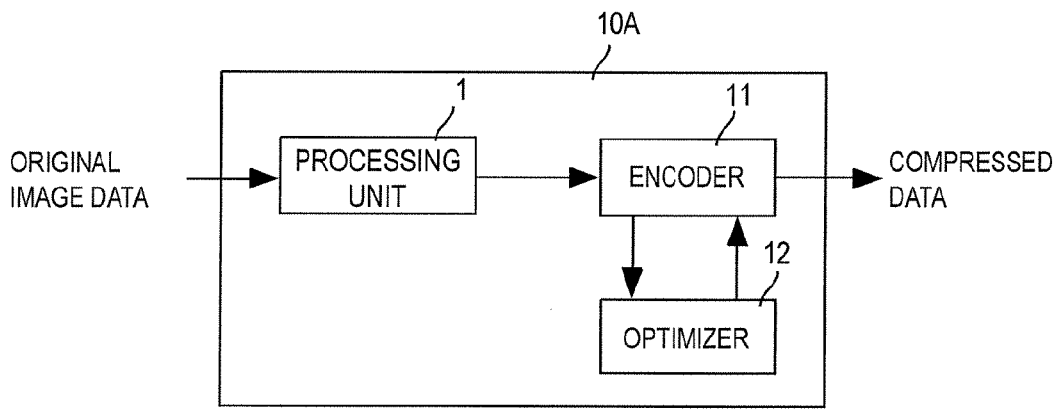
FIG. 8 is a schematic block diagram of the compression processing apparatus according to Embodiment 2.

FIG. 8 is a schematic block diagram of the compression processing apparatus according to Embodiment 2. With reference to FIG. 8, in a compression processing apparatus 10A according to Embodiment 2, the dividing unit 2, the table creating unit 3 and the coding unit 4 in the compression processing apparatus 10 shown in FIG. 1 have been replaced with an encoder 11 and an optimizer 12, and others are the same as the compression processing apparatus 10.

The encoder 11 retains two coding tables each consisting of the Huffman codes. In addition, when not receiving an exchanging signal EXC for exchanging the coding table from the optimizer 12, the encoder 11 performs the Huffman coding on the input data received from the processing unit 1 by using one coding table in the two coding tables, and outputs the compressed data. Moreover, when receiving the exchanging signal EXC from the optimizer 12, the encoder 11 exchanges from one coding table to the other coding table in the two coding tables, performs the Huffman coding on the input data, and outputs the compressed data.

In parallel with the Huffman coding in the encoder 11, the optimizer 12 updates the coding table which is not used for the Huffman coding of the input data by the encoder 11, and also generates and outputs the exchanging signal EXC to the encoder 11.

Figure 9:
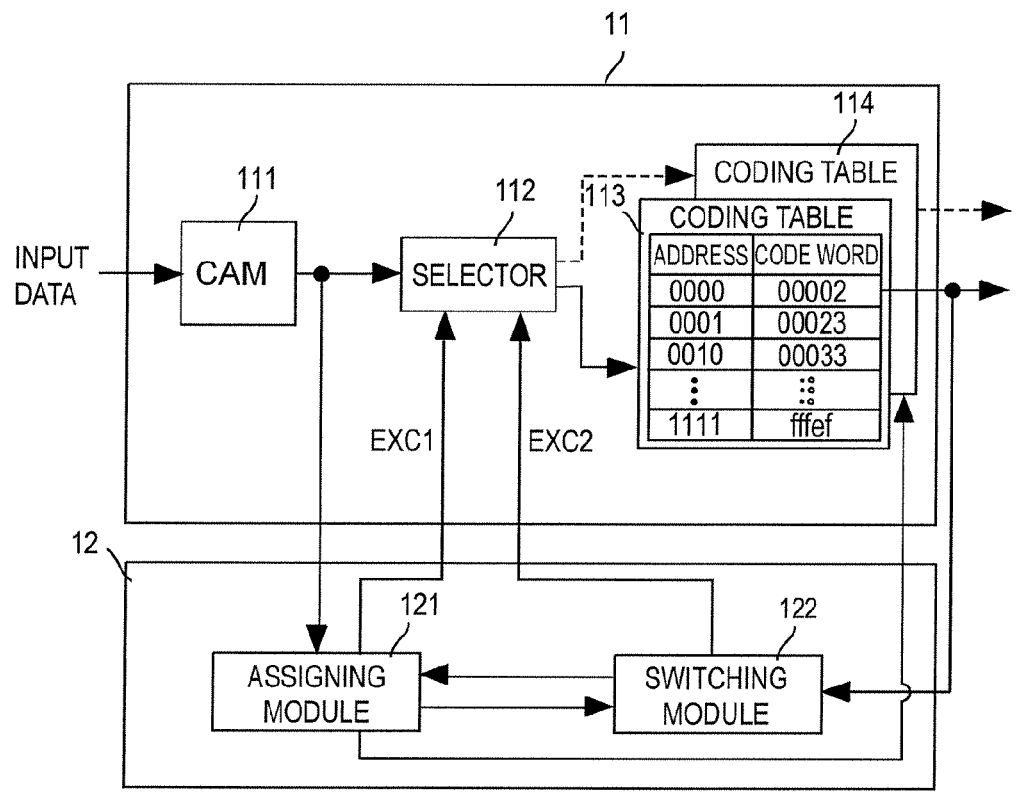
FIG. 9 is a configuration diagram of an encoder and an optimizer shown in FIG. 8.

FIG. 9 is a configuration diagram of the encoder 11 and the optimizer 12 shown in FIG. 8. With reference to FIG. 9, the encoder 11 includes a CAM (Content Addressable Memory) 111, a selector 112, and coding tables 113 and 114. The optimizer 12 includes an assigning module 121 and a switching module 122.

The CAM 111 stores a plurality of memory symbols, and a plurality of addresses associated with the plurality of memory symbols, respectively. The plurality of memory symbols consist of symbols which can be inputted to the CAM 111. When receiving each input symbol constituting the input data from the processing unit 1, the CAM 111 searches the stored plurality of memory symbols, detects the memory symbol matching the input symbol, and also detects the address associated with the detected memory symbol. In addition, the CAM 111 outputs the detected address as a matching address MAdd to the selector 112 and the assigning module 121 in the optimizer 12.

When not receiving exchanging signals EXC1 and EXC2 (a kind of the exchanging signal EXC) from the assigning module 121 and the switching module 122 in the optimizer 12, respectively, the selector 112 outputs the matching address MAdd received from the CAM 111 to the active table 113, and when receiving the exchanging signals EXC1 and EXC2 from the assigning module 121 and the switching module 122, respectively, the selector 112 outputs the matching address MAdd received from the CAM 111 to the shadow table 114.

Each of the active tables 113 and 114 consists of a plurality of addresses and a plurality of code words. The plurality of code words are associated with the plurality of addresses, respectively. In addition, each of the plurality of code words consists of the Huffman code.

When receiving the matching address MAdd from the selector 112, the coding table 113 serves as the active table. In addition, the coding table 113 reads the code word associated with the received matching address MAdd, and outputs the read code word as the compressed data.

Moreover, when not receiving the matching address MAdd from the selector 112, the coding table 113 serves as the shadow table.

The coding table 114 consists of the same configuration as the coding table 113, and serves the same function as the coding table 113.

It should be noted that each of the coding tables 113 and 114 consists of an SRAM (Static Random Access Memory).

When receiving the matching address MAdd from the CAM 111, the assigning module 121 counts the number of times of receiving the matching address MAdd from the CAM 111, and when the counted count value reaches a maximum value Count_MAX, the assigning module 121 generates a new address instead of the matching address MAdd and a new code word by a method to be described below, and updates the coding table 114 (=the shadow table) with the new address and the new code word which have been generated. Moreover, the assigning module 121 outputs the new code word to the switching module 122. Furthermore, when the count values for all the matching addresses MAdd received from the CAM 111 have reached the maximum values Count_MAX, the assigning module 121 generates and outputs the exchanging signal EXC1 to the selector 112.

The switching module 122 receives the new code word from the assigning module 121, and receives the code word (referred to as "old code word", and the same applies to the followings) outputted as the compressed data from the coding table 113 (or the coding table 114) serving as the active table.

In addition, the switching module 122 calculates the compression ratio based on the new code word and the old code word, and when the calculated compression ratio becomes larger than a threshold, the switching module 122 generates and outputs the exchanging signal EXC2 to the selector 112 and the assigning module 121.

Figure 10:
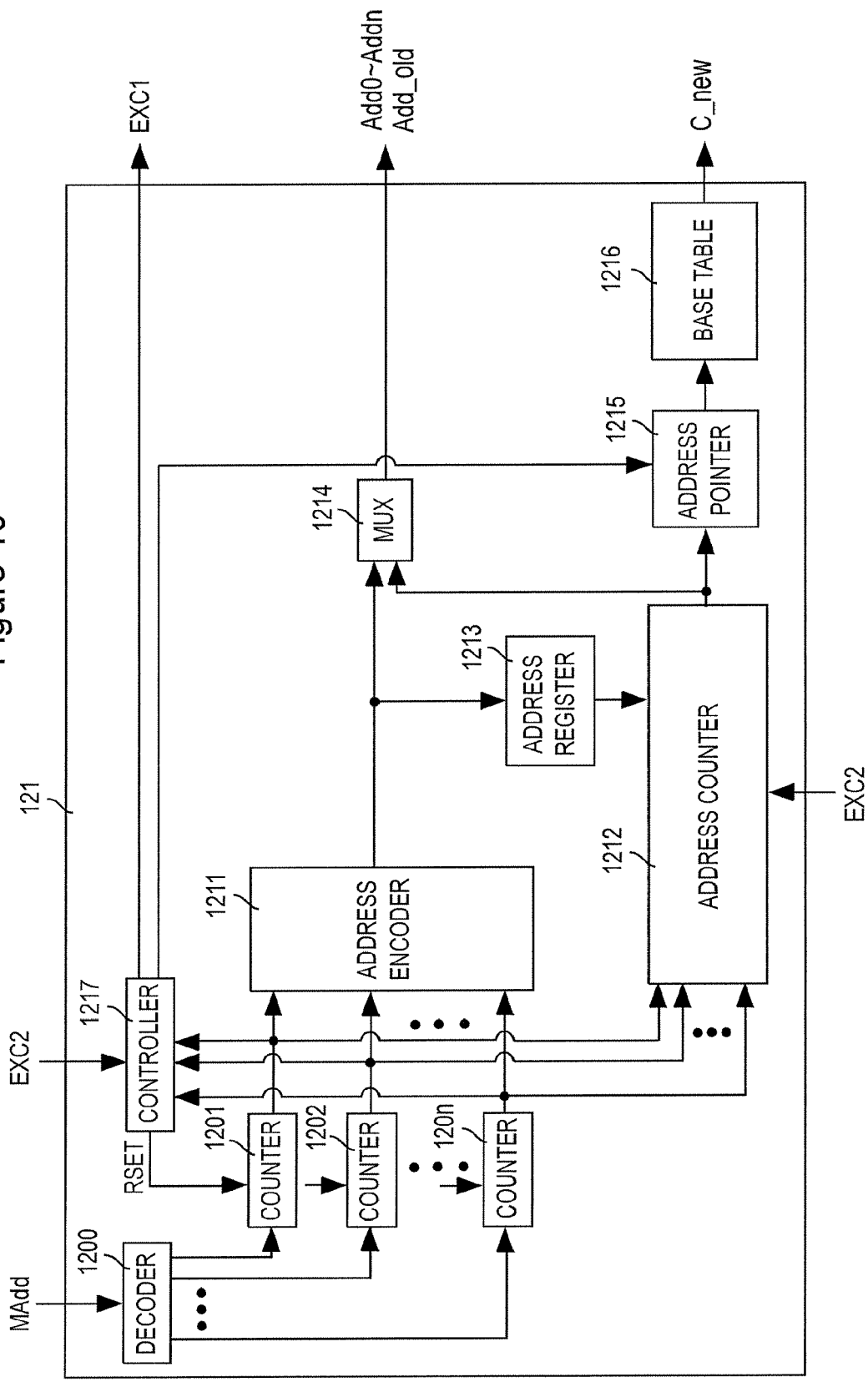
FIG. 10 is a configuration diagram of an assigning module shown in FIG. 9.

FIG. 10 is a configuration diagram of the assigning module 121 shown in FIG. 9. With reference to FIG. 10, the assigning module 121 includes a decoder 1200, counters 1201 to 120$n$ (n is an integer equal to or larger than 2), an address encoder 1211, an address counter 1212, an address register 1213, a multiplexer (MUX) 1214, an address pointer 1215, a base table 1216 and a controller 1217.

The decoder 1200 decodes the matching address MAdd received from the CAM 111 in the encoder 11, and outputs the decoded matching address MAdd to the counter (any of the counters 1201 to 120$n$) provided corresponding to the matching address MAdd.

The counters 1201 to 120$n$ are provided corresponding to n addresses stored in the CAM 111. For each of the counters 1201 to 120$n$, the maximum value Count_MAX has been previously set. This maximum value Count_MAX is decided depending on the type of the data which is a Huffman coding target.

When receiving the matching address MAdd from the decoder 1200, each of the counters 1201 to 120$n$ counts the number of times of receiving the matching address MAdd, and when the count value reaches the maximum value Count_MAX, each of the counters 1201 to 120$n$ generates an overflow signal OFL, and outputs the generated overflow signal OFL to the address encoder 1211, the address counter 1212 and the controller 1217.

Moreover, when receiving a reset signal RSET from the controller 1217, each of the counters 1201 to 120n resets the count value.

The address encoder 1211 retains addresses with which the counters 1201 to 120n are associated, respectively. In addition, when receiving the overflow signal OFL from any of the counters 1201 to 120n, the address encoder 1211 encodes the address with which the counter (any of the counters 1201 to 120n) which has outputted the overflow signal OFL is associated, and outputs the encoded address as an address Add_old to be updated in the shadow table 114, to the address register 1213 and the multiplexer 1214.

The address counter 1212 receives the overflow signal OFL from any of the counters 1201 to 120n, and receives a maximum address Add_old_MAX among the addresses Add_old to be updated, from the address register 1213. In addition, when receiving the overflow signal OFL, the address counter 1212 sequentially generates updated addresses Add_new in a range equal to or less than the maximum address Add_old_MAX, and outputs the generated updated addresses Add_new to the address pointer 1215.

This updated address Add_new indicates an address to be designated in the base table 1216, and as described below, the base table 1216 assigns the address in ascending order of bit length of the code word, and stores the plurality of code words.

Therefore, the address counter 1212 generates the updated addresses Add_new in the range equal to or less than the maximum address Add_old MAX, in order from a small address.

Moreover, when receiving the exchanging signal EXC2 from the switching module 122, the address counter 1212 generates addresses Add0 to Addn in order from "0", and outputs the generated addresses Add0 to Addn to the multiplexer 1214 and the address pointer 1215.

The address register 1213 retains only the maximum address Add_old_MAX among the addresses Add_old received from the address encoder 1211, and also outputs the retained maximum address Add_old_MAX to the address counter 1212.

When receiving the addresses Add_old from the address encoder 1211, the multiplexer 1214 outputs the received addresses Add_old to the shadow table 114.

Moreover, when receiving the addresses Add0 to Addn from the address counter 1212, the multiplexer 1214 outputs the received addresses Add0 to Addn to the coding table 114 (=the shadow table).

When receiving the updated addresses Add_new from the address counter 1212, the address pointer 1215 designates addresses matching the received updated addresses Add_new, in the base table 1216.

Moreover, the address pointer 1215 receives the addresses Add0 to Addn from the address counter 1212, and receives the n addresses with which the counters 1201 to 120n which have outputted the overflow signal OFL are associated, from the controller 1217. In addition, the address pointer 1215 designates addresses not matching the addresses from the controller 1217, among the addresses Add0 to Addn received from the address counter 1212, in the base table 1216.

The base table 1216 stores the plurality of addresses and the plurality of code words. In addition, the plurality of code words are associated with the plurality of addresses, respectively. In this case, the base table 1216 stores the plurality of code words in ascending order of bit length of the code word. Therefore, the code word with a shortest bit length is associated with a minimum address, and the code word with a longest bit length is associated with a maximum address.

When the address is designated by the address pointer 1215, the base table 1216 outputs the code word associated with the designated address, as a new code word C_new, to the coding table 114 (=the shadow table) and the switching module 122.

When receiving the overflow signal OFL from all of the counters 1201 to 120n, the controller 1217 generates the exchanging signal EXC1, outputs the generated exchanging signal EXC1 to the selector 112 in the encoder 11, and also sequentially outputs the n addresses with which the counters 1201 to 120n which have outputted the overflow signal OFL are associated, to the address pointer 1215.

Moreover, when outputting the exchanging signal EXC1, or when receiving the exchanging signal EXC2 from the switching module 122, the controller 1217 generates and outputs the reset signal RSET to the counters 1201 to 120n.

Figure 11:
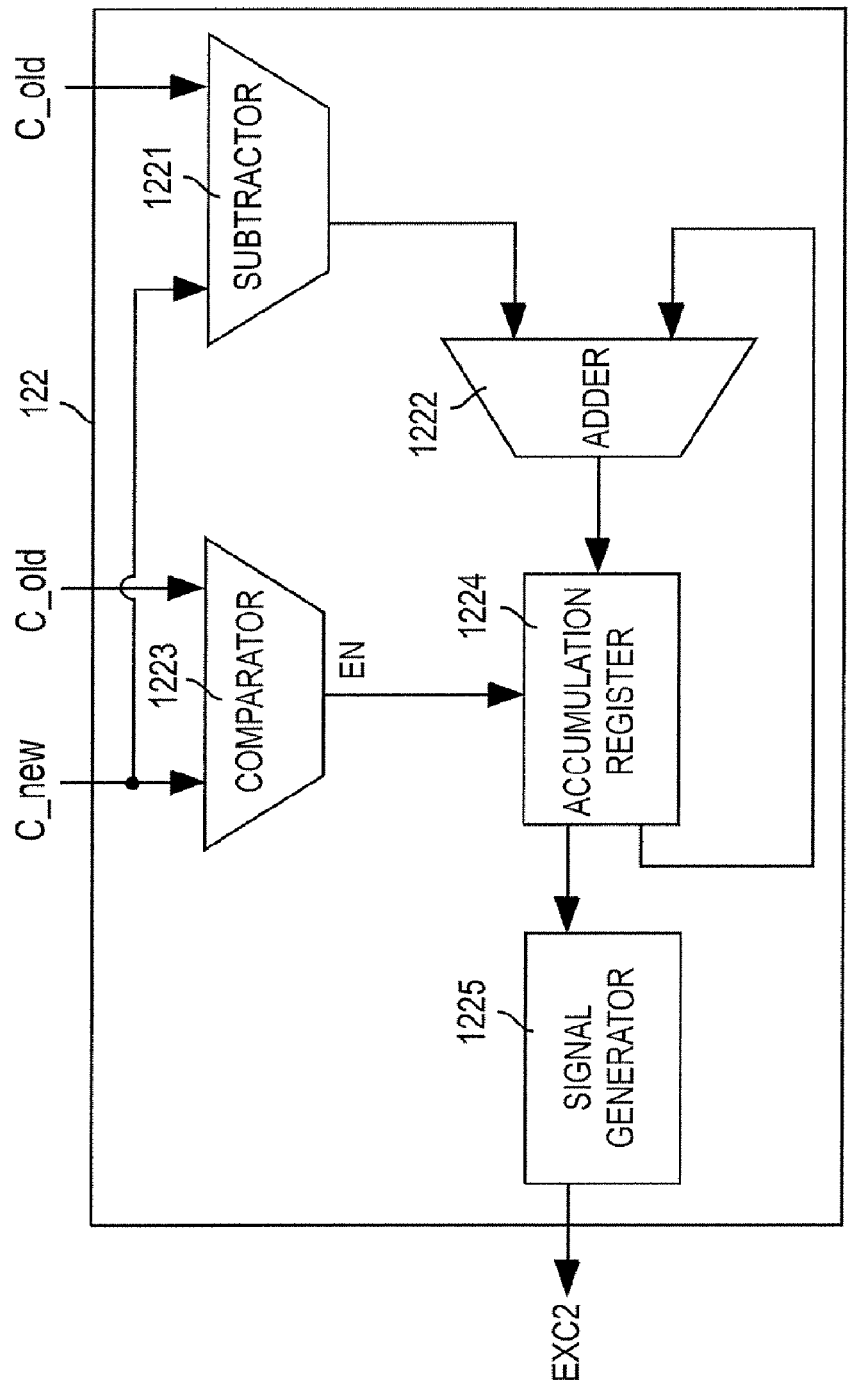
FIG. 11 is a configuration diagram of a switching module shown in FIG. 9.

FIG. 11 is a configuration diagram of the switching module 122 shown in FIG. 9. With reference to FIG. 11, the switching module 122 includes a subtractor 1221, an adder 1222, a comparator 1223, an accumulation register 1224 and a signal generator 1225.

The subtractor 1221 receives the code word C_new from the assigning module 121, and receives a code word C_old from the coding table 113 (or the coding table 114) serving as the active table. In addition, the subtractor 1221 subtracts the code word C_new from the code word C_old, and outputs a result of the subtraction to the adder 1222.

The adder 1222 receives the subtraction result from the subtractor 1221, and receives an accumulated value from the accumulation register 1224. In addition, the adder 1222 adds the subtraction result to the accumulated value, and outputs a result of the addition to the accumulation register 1224.

The comparator 1223 receives the code word C_new from the assigning module 121, and receives the code word C_old from the coding table 113 (or the coding table 114) serving as the active table. In addition, the comparator 1223 compares the bit length of the code word C_new with the bit length of the code word C_old, and when the bit length of the code word C_new is shorter than the bit length of the code word C_old, the comparator 1223 generates an enable signal EN for activating the accumulation register 1224, and outputs the generated enable signal EN to the accumulation register 1224. It should be noted that when the bit length of the code word C_new is equal to or longer than the bit length of the code word C_old, the comparator 1223 does not output the enable signal EN to the accumulation register 1224.

When receiving the enable signal EN from the comparator 1223, the accumulation register 1224 retains the addition result received from the adder 1222, as the accumulated value, and also outputs the retained accumulated value to the adder 1222 and the signal generator 1225.

For the signal generator 1225, a threshold of the compression ratio has been previously set. In addition, the signal generator 1225 compares the accumulated value received from the accumulation register 1224 with the threshold, and when the accumulated value becomes larger than the threshold, the signal generator 1225 generates the exchanging signal EXC2, and outputs the generated exchanging signal EXC2 to the selector 112 in the encoder 11 and the controller 1217 in the assigning module 121.

The accumulation register 1224 is activated by the enable signal EN only when the bit length of the code word C_new is shorter than the bit length of the code word C_old, and outputs the accumulated value to the signal generator 1225. In addition, when the accumulated value is larger than the threshold of the compression ratio, the signal generator 1225 generates the exchanging signal EXC2. Moreover, since the accumulated value is a value in which the subtraction result of the subtraction of the code word C_new from the code word C_old has been accumulated, the accumulated value indicates an accumulated value in which the bit length of the compressed data has been shortened. In the present invention, this accumulated value is referred to as "compression ratio".

Therefore, the signal generator 1225 compares the compression ratio with the threshold, and when the compression ratio is larger than the threshold, the signal generator 1225 generates the exchanging signal EXC2.

Figure 12:
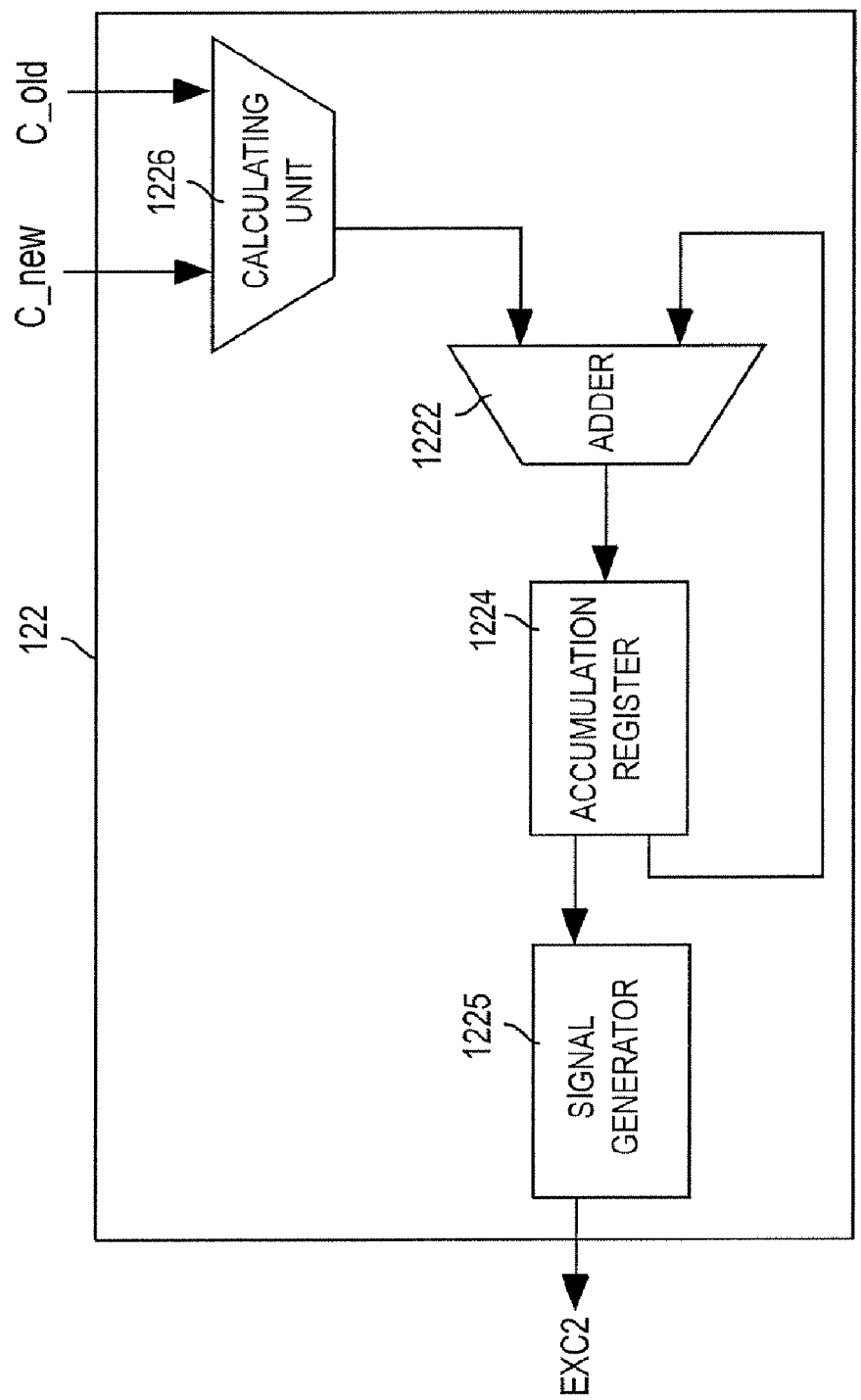
FIG. 12 is another configuration diagram of the switching module shown in FIG. 9.

FIG. 12 is another configuration diagram of the switching module 122 shown in FIG. 9. Moreover, as shown in FIG. 12, if a calculating unit 1226 such as an ALU (Arithmetic Logic Unit) has been used instead of the subtractor 1221, without using the comparator 1223, the value of the accumulation register can be finely adjusted by exercising ingenuity in calculation of C_old and C_new. For example, if the bit length of C_new is longer than C_old, the subtraction result becomes negative. However, the value is also accumulated, and thereby it also becomes possible to keep an efficient code word. Moreover, better effects may be obtained by using not only the subtraction but also the addition or multiplication.

Figure 13:
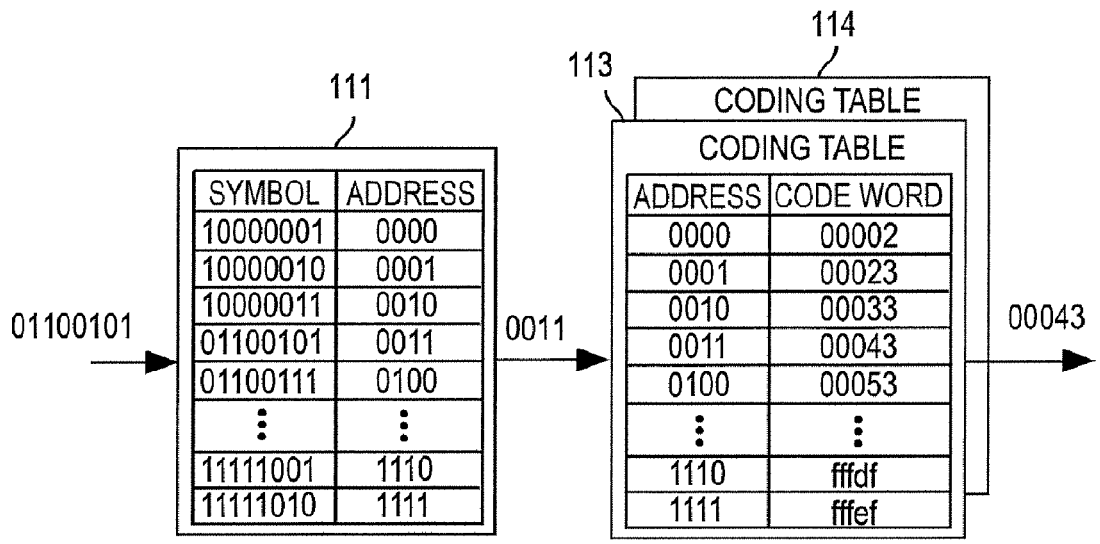
FIG. 13 is a diagram for explaining operations in the Huffman coding by using one coding table.
Figure 14:
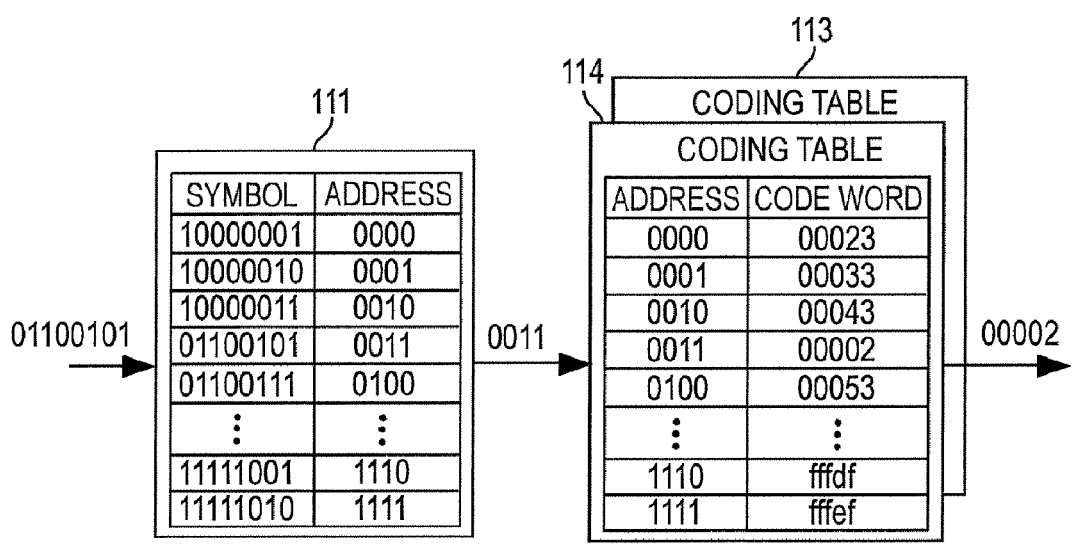
FIG. 14 is a diagram for explaining operations in the Huffman coding by using the other coding table.

FIG. 13 is a diagram for explaining operations in the Huffman coding by using one coding table 113. Moreover, FIG. 14 is a diagram for explaining operations in the Huffman coding by using the other coding table 114. It should be noted that the selector 112 is omitted in FIGS. 13 and 14.

With reference to FIG. 13, when not receiving the exchanging signal EXC1 or EXC2, the selector 112 selects the coding table 113. Therefore, the coding table 113 serves as the active table, and the coding table 114 serves as the shadow table.

The coding table 113 consists of addresses [0000] to [1111] and code words [00002] to [fffef]. In addition, each of the code words [00002] to [fffef] is the Huffman code, and a plurality of the code words [00002] to [fffef] are associated with a plurality of the addresses [0000] to [1111], respectively.

When receiving [01100101] as the input symbol from the processing unit 1, the CAM 111 searches a plurality of memory symbols [10000001], [10000010], . . . , [11111010] which have been stored, detects the memory symbol= [01100101] matching the input symbol=[01100101], and outputs the address=[0011] associated with the detected memory symbol=[01100101], as the matching address MAdd via the selector 112 to the coding table 113 serving as the active table.

When receiving the matching address MAdd=[0011], the coding table 113 detects the code word=[00043] associated with the address=[0011] matching the received matching address MAdd=[0011], and outputs the detected code word= [00043] as the compressed data.

With reference to FIG. 14, when receiving the exchanging signal EXC1 or EXC2, the selector 112 exchanges the coding table to be used from the coding table 113 to the coding table 114. Therefore, the coding table 114 serves as the active table, and the coding table 113 serves as the shadow table.

The coding table 114 consists of the addresses [0000] to [1111] and code words [00023] to [fffef]. In addition, each of the code words [00023] to [fffef] is the Huffman code, and a plurality of the code words [00023] to [fffef] are associated with the plurality of the addresses [0000] to [1111], respectively.

When receiving [01100101] as the input symbol from the processing unit 1, the CAM 111 outputs the matching address MAdd=[0011] via the selector 112 to the coding table 114, by the same operations as the above described operations.

When receiving the matching address MAdd=[0011], the coding table 114 detects the code word=[00002] associated with the address=[0011] matching the received matching address MAdd=[0011], and outputs the detected code word= [00002] as the compressed data.

In this way, the encoder 11 uses the coding table 113 or the coding table 114 to convert the input symbol=[01100101] into the code word=[00043] or [00002].

Also if an input symbol other than the input symbol= [01100101] has been inputted, the encoder 11 converts the input symbol into the code word by the above described operations.

Therefore, the Huffman coding can be readily performed on the input symbol by configuring the encoder 11 with the CAM 111 and the two coding tables 113 and 114.

Figure 15:
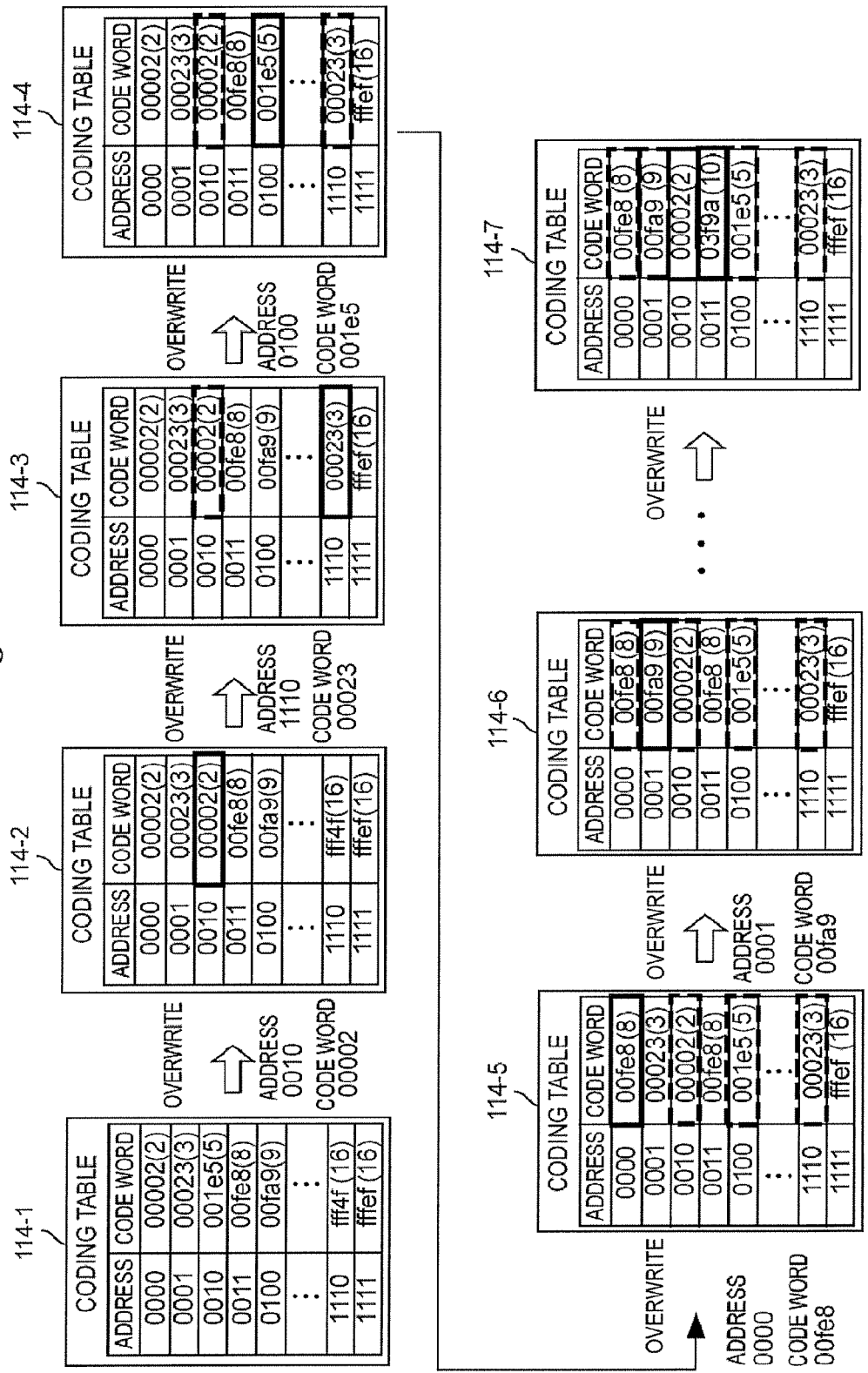
FIG. 15 is a diagram for explaining an update of a coding table serving as a shadow table.

FIG. 15 is a diagram for explaining the update of the coding table 114 serving as the shadow table. It should be noted that, in FIG. 15, a number in parentheses in the code word represents the bit length of the code word.

When all of the counters 1201 to 120n have outputted the overflow signal OFL, or when the compression ratio has become larger than the threshold, roles of the active table and the shadow table are exchanged between the two coding tables 113 and 114.

In addition, in the coding tables 113 and 114 and the base table 1216, the same addresses and the same code words have been originally set as default settings.

For example, if the counter 1203 associated with the address=[0010] outputs the overflow signal OFL by the above described method, the address encoder 1211 encodes the address with which the counter 1203 is associated, and outputs the address=[0010] to the address register 1213 and the multiplexer 1214.

In addition, when receiving the address=[0010] from the address encoder 1211, the address register 1213 compares the already retained address with the address=[0010], and if the already retained address is larger than the address=[0010], the address register 1213 maintains the retention of the already retained address, and if the already retained address is smaller than the address=[0010], the address register 1213 retains the address=[0010] instead of the already retained address. Then, the address register 1213 outputs the address=[0010] as the maximum address Add_old MAX to the address counter 1212.

The address counter 1212 receives the overflow signal OFL from the counter 1203, and receives the maximum address Add_old_MAX from the address register 1213. In addition, the address counter 1212 generates the updated addresses Add_new in the range equal to or less than the maximum address Add_old_MAX, in ascending order of address value, and outputs the generated updated addresses Add_new to the address pointer 1215.

The multiplexer 1214 outputs the addresses Add_old received from the address encoder 1211, to the coding table 114 serving as the shadow table.

On the other hand, the address pointer 1215 designates the address matching the updated address Add_new in the base table 1216, and the base table 1216 outputs the code word= [00002] associated with the address designated by the address pointer 1215, as the code word C_new, to the coding table 114 (=the shadow table) and the switching module 122.

Then, the coding table 114 (=the shadow table) receives the address Add_old=[00002] from the multiplexer 1214 in the assigning module 121, and receives the code word C_new= [00002] from the base table 1216. In addition, the coding table 114 (=the shadow table) overwrites the code word= [001e5(5)] associated with the address=[0010], with the code word C_new=[00002(2)]. A coding table 114-1 (=the shadow table) is thereby updated to a coding table 114-2 (=the shadow table), and the code word associated with the address=[0010] is shortened by three bits (see FIG. 15).

Then, similarly, the code word=[fff4f(16)] associated with the address=[1110] is overwritten with the code word=[00023(3)], and the coding table 114-2 (=the shadow table) is updated to a coding table 114-3 (=the shadow table). The code word associated with the address=[1110] is thereby shortened by 13 bits.

Subsequently, similarly, the coding table 114-3 (=the shadow table) is updated to a coding table 114-4 (=the shadow table). This overwriting of the code word in the coding table 114 (=the shadow table) is repeated until the last counter (any of the counters 1201 to 120n) outputs the overflow signal OFL, or until the compression ratio becomes larger than the threshold.

After the address counter 1212 has received the overflow signal OFL from the last counter (any of the counters 1201 to 120n) and has outputted the updated addresses Add_new to the address pointer 1215, or when the address counter 1212 has received the exchanging signal EXC2 from the switching module 122, the address counter 1212 sequentially generates the addresses starting from "0", and outputs the generated addresses to the multiplexer 1214 and the address pointer 1215.

Moreover, the controller 1217 sequentially outputs the n addresses with which the counters 1201 to 120n which have outputted the overflow signal OFL are associated, to the address pointer 1215.

Then, the address pointer 1215 designates the addresses not matching the addresses from the controller 1217, among the addresses received from the address counter 1212, in the base table 1216. In addition, the base table 1216 reads and outputs the code words associated with the designated addresses to the coding table 114 (=the shadow table).

On the other hand, the multiplexer 1214 outputs the addresses outputted from the address counter 1212, to the coding table 114 (=the shadow table).

Then, the coding table 114 (=the shadow table) receives the addresses from the multiplexer 1214 and the code words from the base table 1216, and based on the received addresses and code words, overwrites the code words which have not been overwritten with the code words in the process of the overwriting, with the code words received from the base table 1216.

As a result, as shown in FIG. 15, in the overwrite, the code words associated with the addresses=[0000], [0001], . . . , [0011] are overwritten with the code words=[00fe8], [00fa9], [03f9a], respectively. The coding table 114-4 (=the shadow table) is thereby updated in a sequential manner to coding tables 114-5, 114-6 and 114-7 (=the shadow tables), and redundant code words are eliminated. This process is performed until a value of the maximum address Add_old_MAX.

In the above described update of the coding table 114 (=the shadow table), the assigning module 121 outputs shorter code words in order of the reception of the overflow signal OFL, to the coding table 114 (=the shadow table), and updates the coding table 114 (=the shadow table). Therefore, the assigning module 121 assigns the code word with the shorter length to one of the coding target data for which the count value of the frequency of occurrence has reached the maximum value earlier in order thereof.

Moreover, the above described update of the coding table 114 (=the shadow table) is performed in parallel with the operations of converting the input symbol into the Huffman code in the encoder 11 by the above described method by using the coding table 113 (=the active table).

It should be noted that, when the coding table 113 serves as the shadow table, the coding table 113 is also updated by the above described method.

Figure 16:
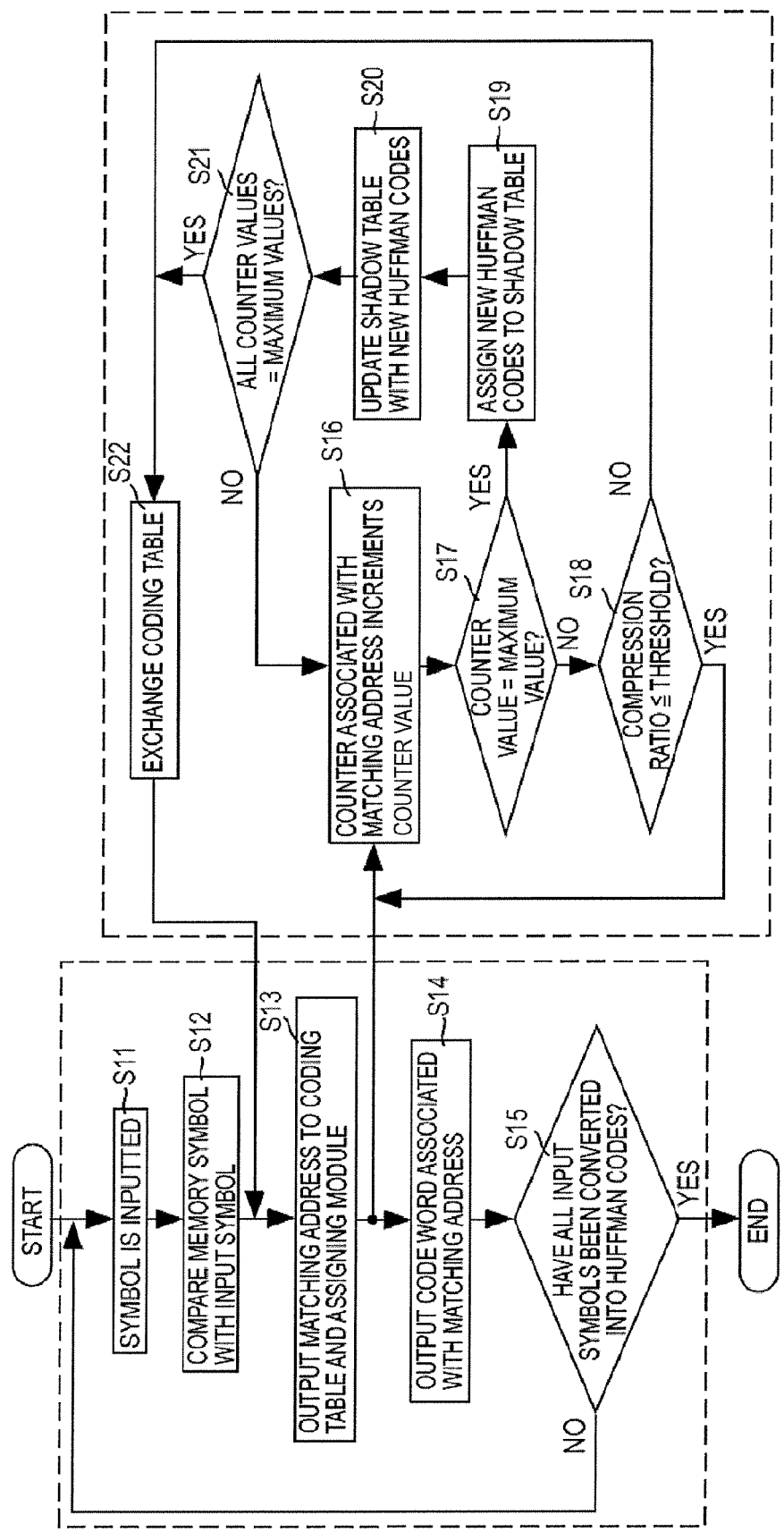
FIG. 16 is a flowchart for explaining operations in the encoder and the optimizer shown in FIG. 9.

FIG. 16 is a flowchart for explaining operations in the encoder 11 and the optimizer 12 shown in FIG. 9.

With reference to FIG. 16, when a series of operations are started, the CAM 111 in the encoder 11 receives the input symbol (step S11), and compares the received input symbol with the memory symbol (step S12).

In addition, if the CAM 111 in the encoder 11 detects the address associated with the memory symbol matching the input symbol, the CAM 111 in the encoder 11 outputs the detected address as the matching address MAdd to the selector 112 and the assigning module 121. In addition, the selector 112 in the encoder 11 outputs the matching address MAdd to the coding table 113 (=the active table) and the assigning module 121 (step S13).

Subsequently, the coding table 113 (=the active table) in the encoder 11 outputs the code word associated with the address matching the matching address MAdd (step S14).

Then, it is determined whether or not all of the input symbols have been converted into the Huffman codes (step S15), and if all of the input symbols have not been converted into the Huffman codes, the series of operations return to step S11, and the above described steps S11 to S15 are repeatedly executed in the encoder 11.

On the other hand, in step S15, when it has been determined that all of the input symbols have been converted into the Huffman codes, the series of operations are terminated.

After step S13, in the optimizer 12, the counter (any of the counters 1201 to 120n) associated with the matching address MAdd increments a counter value by "1" (step S16), and the counter (any of the counter 1201 to 120n) determines whether or not the counter value is the maximum value (step S17).

In step S17, when it has been determined that the counter value is not the maximum value, the switching module 122 determines whether or not the compression ratio is equal to or less than the threshold, by the above described method (step S18).

In step S18, when it has been determined that the compression ratio is equal to or less than the threshold, the series of operations return to step S16, and the above described steps S16 to S18 are repeatedly executed.

On the other hand, in step S18, when it has been determined that the compression ratio is larger than the threshold, the series of operations proceed to step S22.

On the other hand, in step S17, when it has been determined that the counter value is the maximum value, new Huffman codes are assigned to the coding table 114 (=the shadow table) by the above described method (step S19), and the coding table 114 (=the shadow table) is updated with the new Huffman codes (step S20).

Then, it is determined whether or not all of the counter values are the maximum values (step S21), and when all of the counter values are the maximum values, the series of operations proceed to step S22.

On the other hand, in step S21, when it has been determined that at least one of all of the counter values is not the maximum value, the series of operations proceed to step S16.

When it has been determined in step S18 that the compression ratio is larger than the threshold, or when it has been determined in step S21 that all of the counter values are the maximum values, the coding table is exchanged (step S22). In addition, the series of operations proceed to step S13.

It should be noted that the above described steps S11 to S15 are executed by the encoder 11, and the above described steps S16 to S22 are executed by the optimizer 12. Therefore, the operations in the optimizer 12 are performed in parallel with the operations in the encoder 11.

Figure 17:
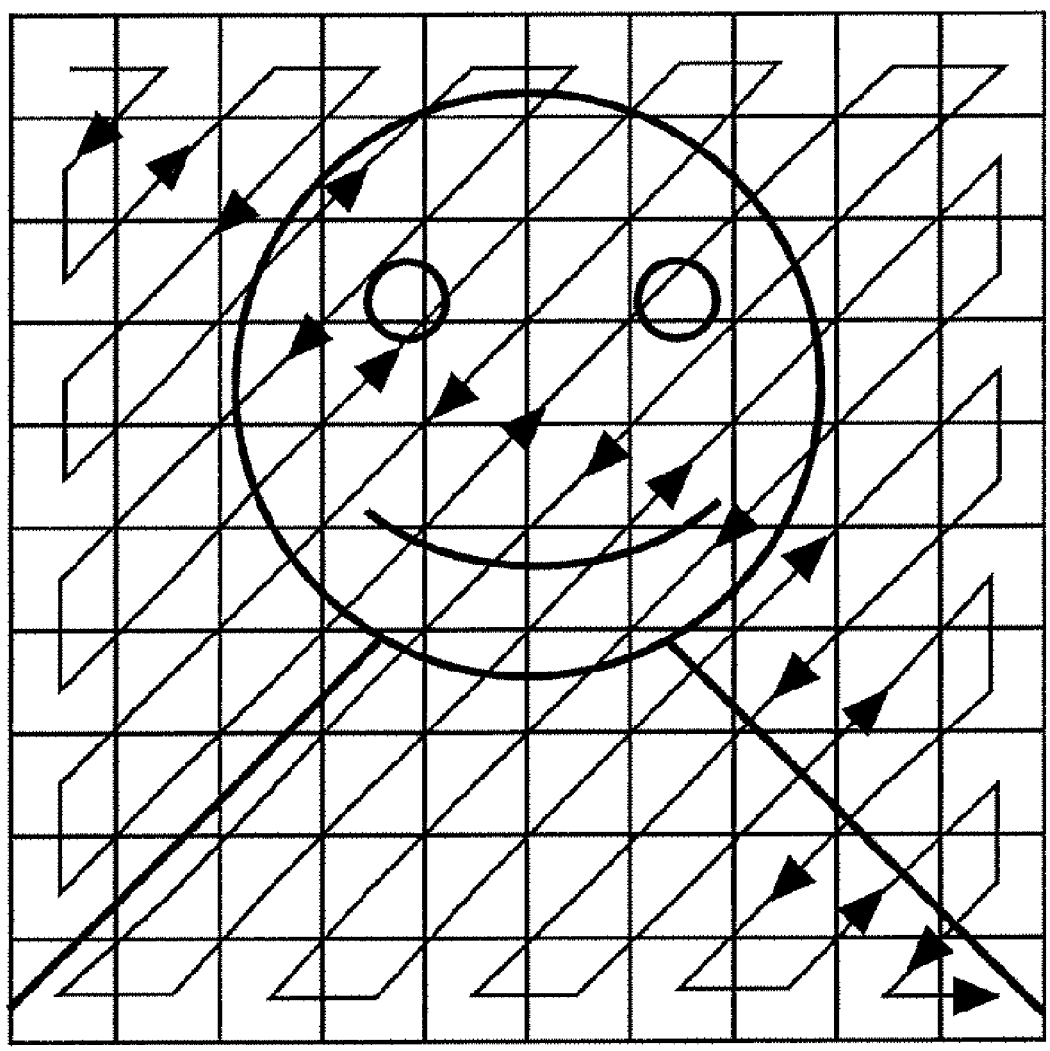
FIG. 17 is a diagram for specifically explaining the Huffman coding in the compression processing apparatus shown in FIG. 8.

FIG. 17 is a diagram for specifically explaining the Huffman coding in the compression processing apparatus 10A shown in FIG. 8.

With reference to FIG. 17, the encoder 11 receives the input data after the zigzag scan and the run-length process have been performed in the processing unit 1.

In addition, the encoder 11 performs the Huffman coding on each symbol constituting the input data by using the coding table 113 (=the active table) by the above described method. Here, in a case of performing the Huffman coding on a background portion in a person's image shown in FIG. 17, the encoder 11 performs the Huffman coding on coding target data in the background portion by using the coding table 113 (=the active table) as long as the compression ratio is equal to or less than the threshold. Therefore, the encoder 11 performs the Huffman coding on the coding target data in the background portion while creating a Huffman coding table suitable for the Huffman coding on the background portion, by using some code words stored in the coding table 113 (=the active table).

Then, when receiving coding target data in a face portion in the person's image, the encoder 11 performs the Huffman coding on the coding target data in the face portion by using the coding table 113 (=the active table) as long as the compression ratio is equal to or less than the threshold, and if the compression ratio becomes larger than the threshold, the encoder 11 exchanges to the coding table 114 (=the shadow table) and performs the Huffman coding on the coding target data in the face portion. Therefore, when the encoder 11 performs the Huffman coding on the coding target data in the face portion, the encoder 11 performs the Huffman coding on the coding target data in the face portion while creating a Huffman coding table suitable for the Huffman coding on the face portion, by using some code words stored in the coding table 113 (=the active table) or some code words stored in the coding table 114 (=the shadow table).

The same also applies to a case where the encoder 11 performs the Huffman coding on coding target data in a body portion in the person's image.

As a result, the encoder 11 and the optimizer 12 perform the Huffman coding on the input data inputted from the processing unit 1, and thereby segment the person's image into subsets of the background portion, the face portion and the body portion, and also perform the Huffman coding on the subsets of the background portion, the face portion and the body portion, respectively, while creating the Huffman coding tables suitable for the subsets of the background portion, the face portion and the body portion, respectively.

In this case, the encoder 11 constitutes the dividing unit 2 and the coding unit 4 shown in FIG. 1, and the encoder 11 and the optimizer 12 constitute the table creating unit 3 shown in FIG. 1.

Therefore, the compression processing apparatus 10A (see FIG. 8) according to Embodiment 2 consists of the same configuration as the compression processing apparatus 10 (see FIG. 1) according to Embodiment 1.

Figure 18:
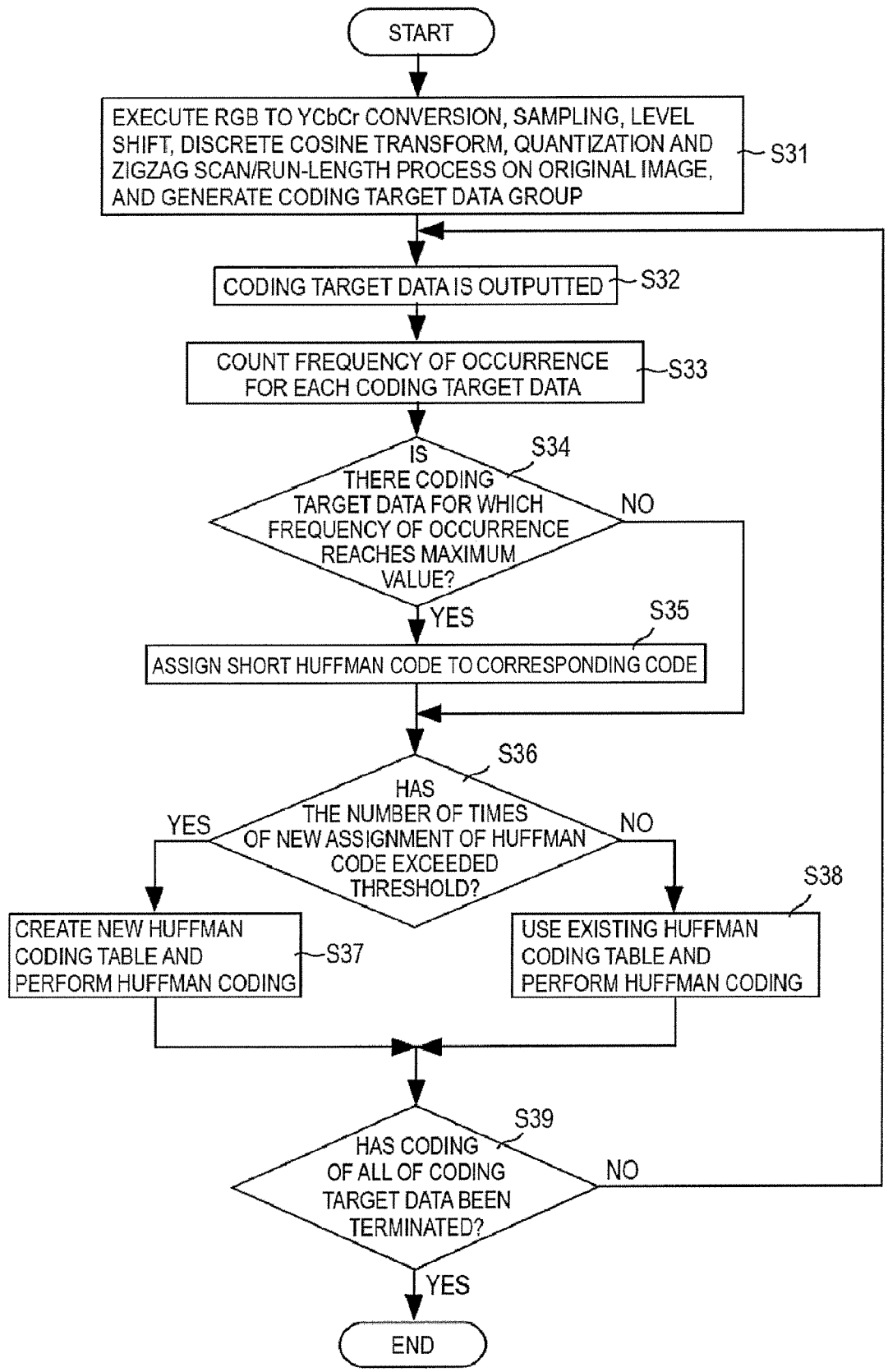
FIG. 18 is a flowchart for explaining the compression processing method in Embodiment 2.

FIG. 18 is a flowchart for explaining the compression processing method in Embodiment 2.

With reference to FIG. 18, when a series of operations are started, the processing unit 1 in the compression processing apparatus 10A executes the RGB to YCbCr conversion, the sampling, the level shift, the discrete cosine transform, the quantization and the zigzag scan/run-length process on the original image, and generates the coding target data group (=the input data) (step S31).

In addition, the processing unit 1 outputs the coding target data to the encoder 11 (step S32), and the encoder 11 detects the address associated with the memory symbol matching the coding target data (=the input symbol) received from the processing unit 1, and outputs the detected address as the matching address MAdd to the optimizer 12.

In addition, the optimizer 12 counts the number of times of receiving the matching address MAdd, and thereby counts the frequency of occurrence for each coding target data (step S33).

Then, the optimizer 12 determines whether or not there is the coding target data for which the frequency of occurrence reaches the maximum value (=the maximum value Count_MAX), by determining whether or not any of the counters 1201 to 120$n$ has outputted the overflow signal OFL (step S34). In this case, when any of the counters 1201 to 120$n$ has outputted the overflow signal OFL, the optimizer 12 determines that there is the coding target data for which the frequency of occurrence reaches the maximum value (=the maximum value Count_MAX), and when any of the counters 1201 to 120$n$ does not output the overflow signal OFL, the optimizer 12 determines that there is no coding target data for which the frequency of occurrence reaches the maximum value (=the maximum value Count_MAX).

In step S34, when it has been determined that there is the coding target data for which the frequency of occurrence reaches the maximum value (=the maximum value Count_MAX), the optimizer 12 updates the coding table 114 (=the shadow table) by the above described method, and assigns a short Huffman code to a corresponding code (step S35).

After step S35 or in step S34, when it has been determined that there is no coding target data for which the frequency of occurrence reaches the maximum value (=the maximum value Count_MAX), the optimizer 12 determines whether or not the number of times of new assignment of the Huffman code has exceeded a threshold, by determining whether or not all of the counters 1201 to 120$n$ have outputted the overflow signal OFL (step S36).

In this case, when all of the counters 1201 to 120$n$ have outputted the overflow signal OFL, the optimizer 12 determines that the number of times of the new assignment of the Huffman code has exceeded the threshold, and when at least one of the counters 1201 to 120$n$ does not output the overflow signal OFL, the optimizer 12 determines that the number of times of the new assignment of the Huffman code has not exceeded the threshold.

In step S36, when it has been determined that the number of times of the new assignment of the Huffman code has exceeded the threshold, the encoder 11 exchanges the active table from the coding table 113 to the coding table 114, and performs the Huffman coding on the coding target data while creating a new Huffman coding table in the exchanged coding table 114 (step S37).

On the other hand, in step S36, when it has been determined that the number of times of the new assignment of the Huffman code has not exceeded the threshold, the encoder 11 performs the Huffman coding on the coding target data by using the Huffman coding table which has already been created by using the coding table 113 (step S38).

After step S37 or step S38, it is determined whether or not the coding of all of the coding target data has been terminated (step S39). In step S39, when it has been determined that the coding of at least one of the coding target data has not been terminated, the series of operations return to step S32, and the above described steps S32 to S39 are repeatedly executed until it is determined in step S39 that the coding of all of the coding target data has been terminated.

In step S39, if it is determined that the coding of all of the coding target data has been terminated, the series of operations are terminated.

As described above, in Embodiment 2, the compression processing apparatus 10A performs the Huffman coding on the coding target data while dividing the input data into the subsets and creating the Huffman coding tables suitable for the divided subsets.

Therefore, the Huffman coding can be performed on the coding target data at high speed, and also the compression ratio can be improved.

Others are the same as Embodiment 1.

It should be noted that, in Embodiment 2, the coding tables 113 and 114 constitute "table retaining unit", and the optimizer 12 constitutes "updating unit".

Embodiment 3

Figure 19:
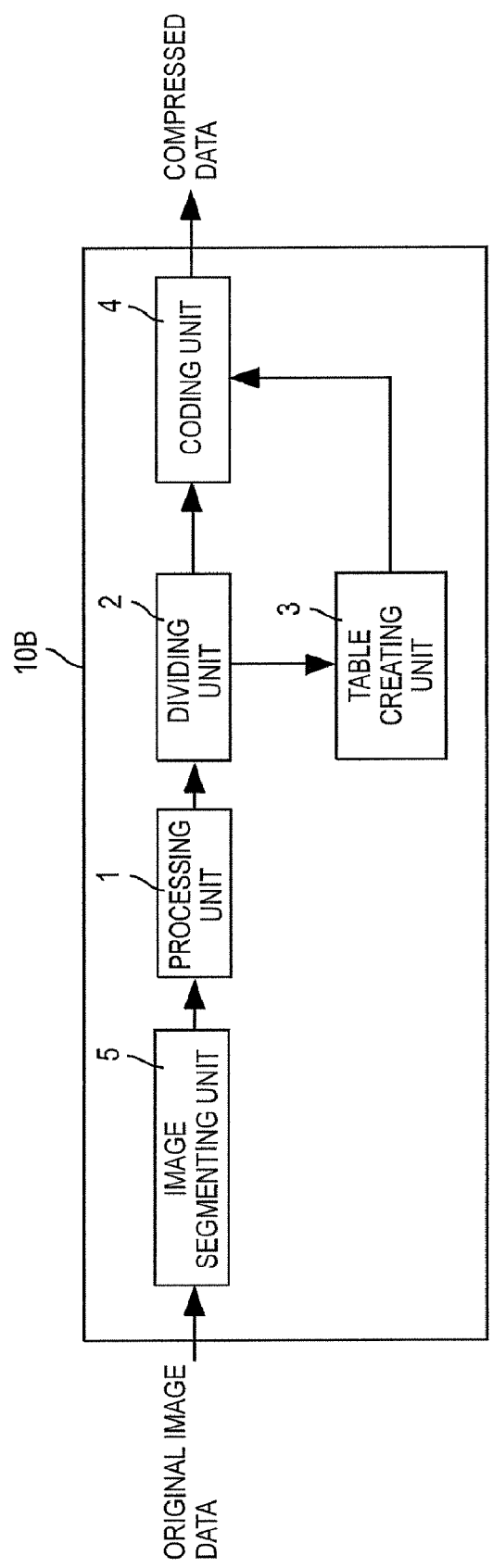
FIG. 19 is a schematic block diagram of the compression processing apparatus according to Embodiment 3.

FIG. 19 is a schematic block diagram of the compression processing apparatus according to Embodiment 3. With reference to FIG. 19, a compression processing apparatus 10B according to Embodiment 3 is equal to a compression processing apparatus that an image segmenting unit 5 is added to the compression processing apparatus 10 shown in FIG. 1, and others are the same as the compression processing apparatus 10.

The image segmenting unit 5 segments original image data into a plurality of image data based on target objects in the original image, and outputs the segmented plurality of image data to the processing unit 1.

In the compression processing apparatus 10B, the processing unit 1 processes the plurality of image data inputted from the image segmenting unit 5, for each of the image data by the above described method, and outputs a plurality of input data corresponding to the plurality of image data, to the dividing unit 2.

Moreover, in the compression processing apparatus 10B, the dividing unit 2 executes a process for dividing into a plurality of subsets for each of the input data, for all of the input data in the plurality of input data, and the table creating unit 3 executes a process for creating a plurality of Huffman coding tables suitable for the plurality of subsets divided for each of the input data, for all of the input data in the plurality of input data, and the coding unit 4 executes a process for performing the Huffman coding on coding target data included in the plurality of subsets for each of the input data, for each subset, by using the plurality of Huffman coding tables suitable for the plurality of subsets, for all of the input data in the plurality of input data.

An image segmentation method in the image segmenting unit 5 shown in FIG. 19 will be described. The image segmenting unit 5 segments an image into a plurality of images, for example, by using a region growing type segmentation algorithm.

This region growing type segmentation algorithm is a method of segmenting the image, for example, by repeating a process for deciding a leader cell from 3×3 pixels and for performing region growing from a region of the decided leader cell to regions of peripheral pixels having relatively large connection weights, until no leader cell exists.

Figure 20:
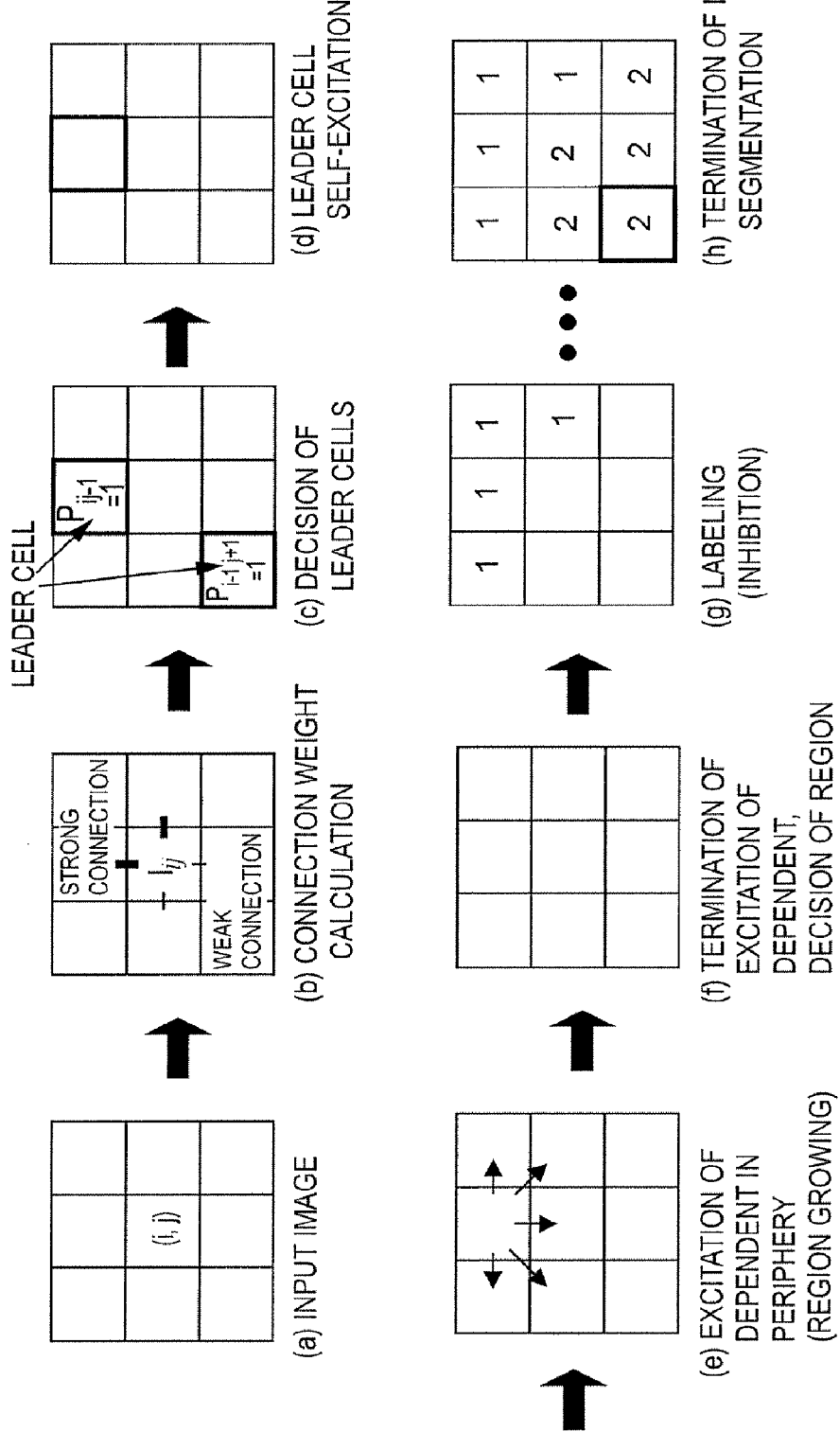
FIG. 20 is a diagram for explaining an image segmentation method.

FIG. 20 is a diagram for explaining an image segmentation method. The image segmenting unit 5 segments one frame into images of the respective target objects by a region growing type image segmentation method.

This region growing type image segmentation method handles behavior of an oscillator for each pixel in an oscillator network of the LEGION model (D. L. Wang, and D. Terman, "Image segmentation based on oscillator correlation," Neural Computation, Volume 9(4), pp. 805-836 (1997)), in four states of Self-Excitation, Self-Excitable, Excitation and Inhibition. In addition, this region growing type image segmentation method consists of four steps of initialization, self-excitation, excitation and inhibition.

The image segmenting unit 5 receives an input image consisting of a 3×3 configuration shown in (a) of FIG. 20. The image segmenting unit 5 calculates eight inter-pixel connection weights CW1 to CW8 among nine pixels constituting the input image, and retains the calculated eight connection weights CW1 to CW8 corresponding to each inter-pixel in a memory (embedded in the image segmenting unit 5). It should be noted that, in (b) of FIG. 20, eight connection weights between a pixel of (2,2) and peripheral pixels are shown.

Then, the image segmenting unit 5 reads the eight connection weights CW1 to CW8 retained in the memory, and calculates a sum SUM(CW) of the read eight connection weights CW1 to CW8. The image segmenting unit 5 determines whether or not the calculated sum SUM(CW) is larger than a threshold $\phi_P$ for deciding the leader cell. It should be noted that, in the present application, SUM means calculation of a sum represented by sigma notation in mathematics.

When the image segmenting unit 5 has determined that the sum SUM(CW) is larger than the threshold $\phi_P$, the image segmenting unit 5 sets a pixel at a center of the connection weight calculation as the leader cell, and sets a leader cell flag $p_{ij}=1$. On the other hand, when the image segmenting unit 5 has determined that the sum SUM(CW) is equal to or less than the threshold $\phi_P$, the image segmenting unit 5 does not set the pixel at the center of the connection weight calculation as the leader cell, and sets the leader cell flag $p_{ij}=0$.

The image segmenting unit 5 executes this process by setting each of the nine pixels of the input image as the pixel at the center of the connection weight calculation, and decides the leader cells (see (c) of FIG. 20).

Then, the image segmenting unit 5 causes one of the leader cells to perform the self-excitation (excitation flag $x_{ij}=1$) (see (d) of FIG. 20). If cells $(k,l) \in N_{ij}$ corresponding to eight pixels adjacent to each cell (i,j) have performed the excitation, the image segmenting unit 5 calculates a sum $SUM_{\epsilon Nij \wedge kl=1} W_{ij;kl}$ of the connection weights between the cell (i,j) and the cells (k,l), and if the calculated sum $SUM_{(k,l) \in Nij \wedge kl=1} W_{ij;kl}$ is larger than a threshold $\phi_Z$ and the cell (i,j) has not yet belonged to any segmented region (label flag $l_{ij}=0$), the image segmenting unit 5 automatically causes the excitation ($x_{ij}=1$) (excitation of dependent, the region growing) (see (e) of FIG. 20). According to this excitation-of-dependent process, the region is widened, and as shown in (f) of FIG. 20, when there is no cell which newly performs the excitation, segmentation of one region is terminated.

Then, in order to save this segmented region, as shown in (g) of FIG. 20, the image segmenting unit 5 writes a label number for identifying the segmented region, to the cell which has performed the excitation, sets the label flag ($l_{ij}=1$) indicating that the cell which has performed the excitation is a cell which has already been segmented, and performs an inhibition process ($x_{ij}=0$, $p_{ij}=0$).

When the inhibition process is terminated, the image segmenting unit 5 returns to a self-excitation process again for the segmentation of the next region. The image segmenting unit 5 repeatedly executes the above described process until no leader cell exists, and segments each region. After all of the leader cells have performed the excitation, the image segmenting unit 5 performs labeling to all of the regions, and terminates the image segmentation of one frame (see (h) of FIG. 20).

Figure 21:
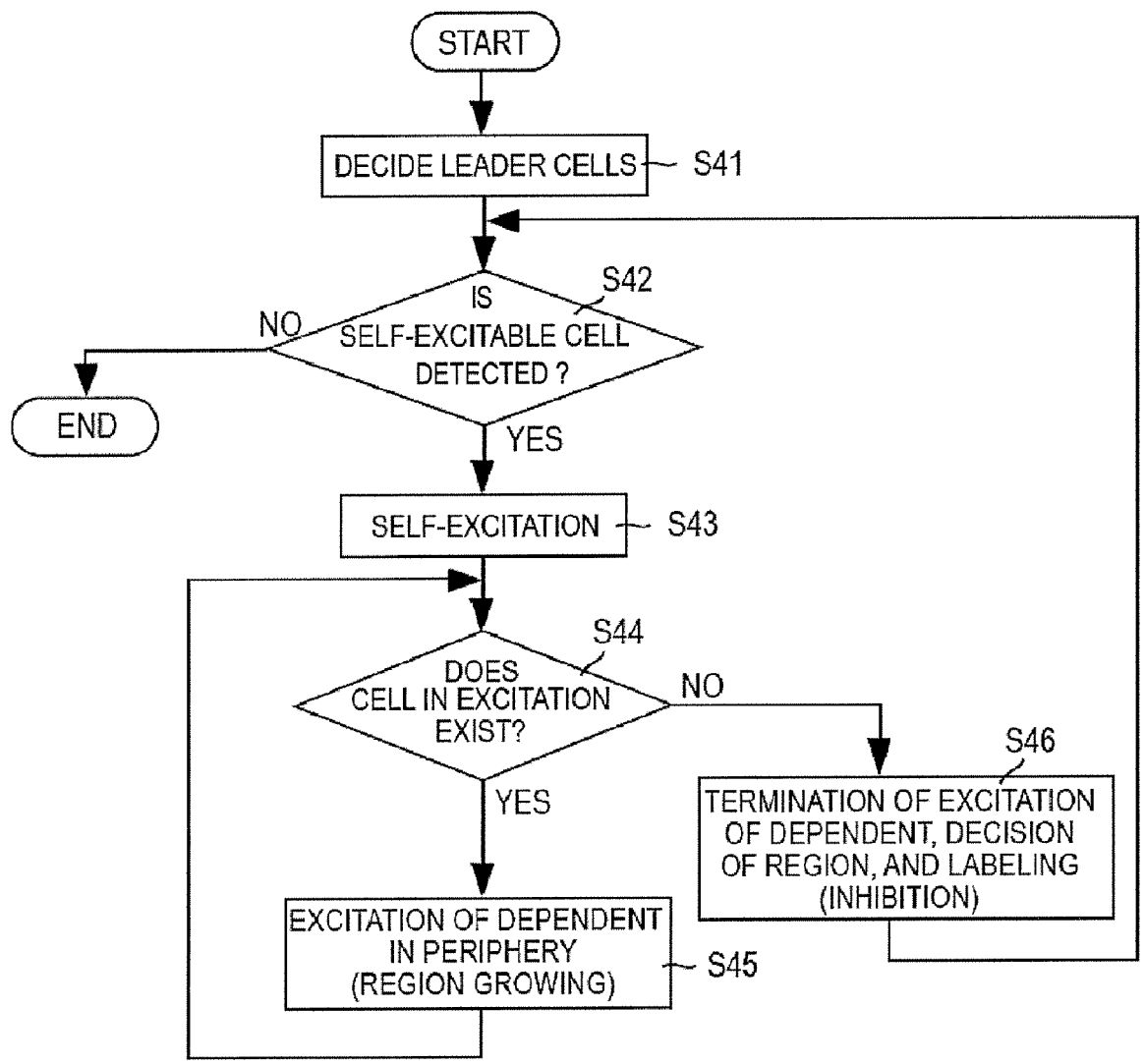
FIG. 21 is a flowchart for explaining the image segmentation method using a region growing type segmentation algorithm.

FIG. 21 is a flowchart for explaining the image segmentation method using the region growing type segmentation algorithm.

With reference to FIG. 21, when a series of operations are started, the image segmenting unit 5 calculates respective inter-pixel connection weights among a plurality of pixels constituting one frame, and also decides the leader cells by the above described method (step S41).

The image segmenting unit 5 determines whether or not a self-excitable cell has been detected (step S42), and when the image segmenting unit 5 has determined that the self-excitable cell has been detected, the image segmenting unit 5 performs the self-excitation by the above described method (step S43).

Then, the image segmenting unit 5 determines whether or not the cell in the excitation exists (step S44), and when the cell in the excitation exists, the image segmenting unit 5 performs the excitation of dependent in periphery (the region growing) by the above described method (step S45). The series of operations return to step S44, and steps S44 and S45 are repeatedly executed until no cell in the excitation exists in step S44.

In step S44, when it is determined that no cell in the excitation exists, the image segmenting unit 5 performs termination of the excitation of dependent, and decision of the region, by the above described method, and also performs the labeling (the inhibition) (step S46). Then, the series of operations return to step S42, and steps S42 to S46 are repeatedly executed until it is determined in step S42 that no self-excitable cell is detected.

In step S42, if it is determined that no self-excitable cell is detected, the series of operations are terminated.

It should be noted that the image segmenting unit 5 repeatedly executes the flowchart shown in FIG. 21, and segments each frame into the images of the respective target objects.

Figure 22:
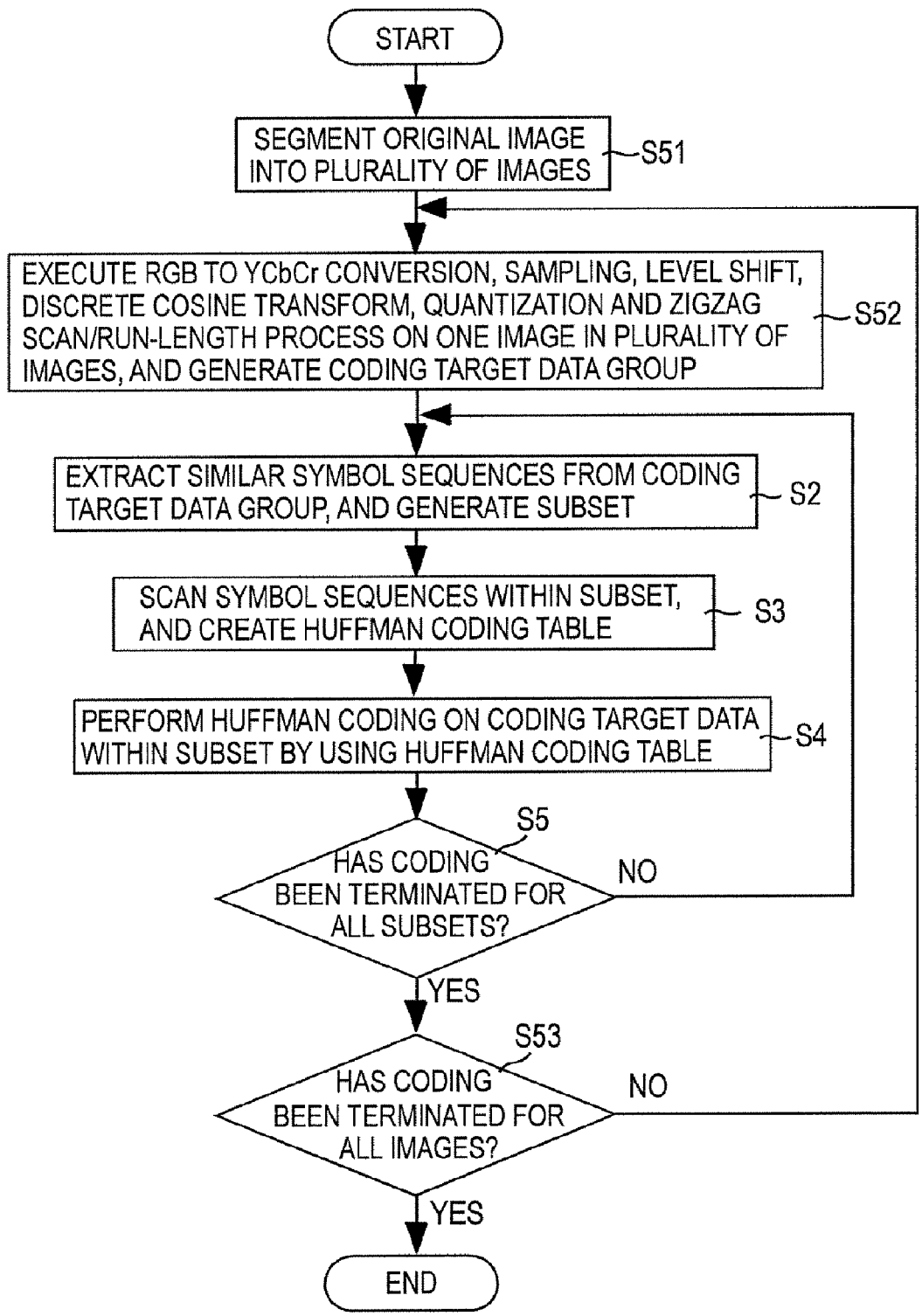
FIG. 22 is a flowchart for explaining the compression processing method in Embodiment 3.

FIG. 22 is a flowchart for explaining the compression processing method in Embodiment 3. In the flowchart shown in FIG. 22, steps S51 to S53 have been added to steps S2 to S5 of the flowchart shown in FIG. 7, and others are the same as the flowchart shown in FIG. 7.

With reference to FIG. 22, when a series of operations are started, the image segmenting unit 5 in the compression processing apparatus 10B segments the original image into the plurality of images according to the flowchart shown in FIG. 21 (step S51).

The processing unit 1 executes the RGB to YCbCr conversion, the sampling, the level shift, the discrete cosine transform, the quantization and the zigzag scan/run-length process on one image in the plurality of images, and generates the coding target data group (=the input data) (step S52).

Then, the above described steps S2 to S5 are sequentially executed. In step S5, if it is determined that the coding has been terminated for all of the subsets, it is determined whether or not the coding has been terminated for all of the images (step S53).

In step S53, when it has been determined that the coding has not been terminated for all of the images, the series of operations return to step S52, and the above described steps S52, S2 to S5, and S53 are repeatedly executed until it is determined in step S53 that the coding has been terminated for all of the images.

In step S53, if it is determined that the coding has been terminated for all of the images, the series of operations are terminated.

Figure 23:
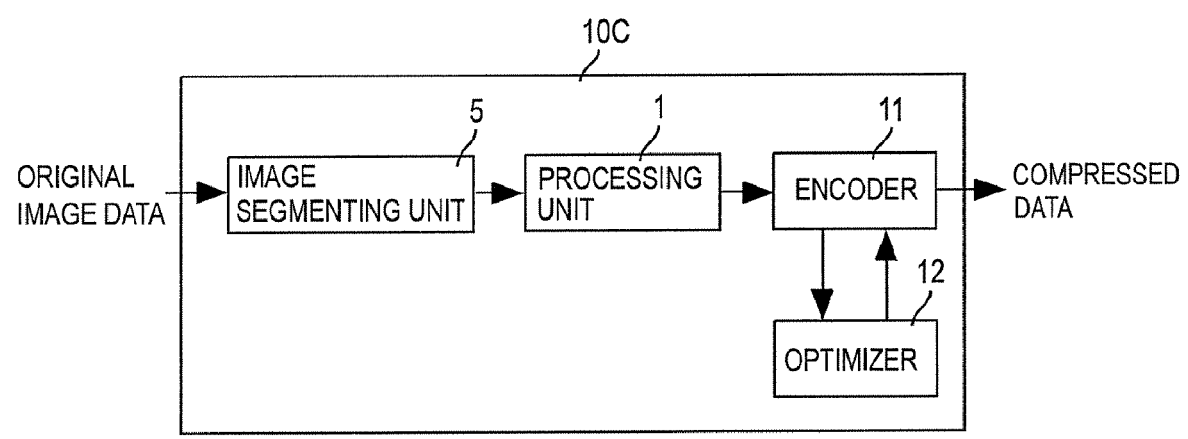
FIG. 23 is a schematic block diagram showing another configuration of the compression processing apparatus according to Embodiment 3.

FIG. 23 is a schematic block diagram showing another configuration of the compression processing apparatus according to Embodiment 3. The compression processing apparatus according to Embodiment 3 may be a compression processing apparatus 10C shown in FIG. 23.

With reference to FIG. 23, the compression processing apparatus 10C is equal to a compression processing apparatus that the image unit 5 is added to the compression processing apparatus 10A shown in FIG. 8, and others are the same as the compression processing apparatus 10A.

The image segmenting unit 5 has been described above. Therefore, the compression processing apparatus 10C segments the original image into the plurality of images with a focus on the target objects, and for each of the segmented plurality of images, executes the division into the plurality of subsets, and a process for performing the Huffman coding on all of the coding target data included in the plurality of subsets while creating the plurality of Huffman coding tables suitable for the plurality of subsets, and compresses the original image data.

Figure 24:
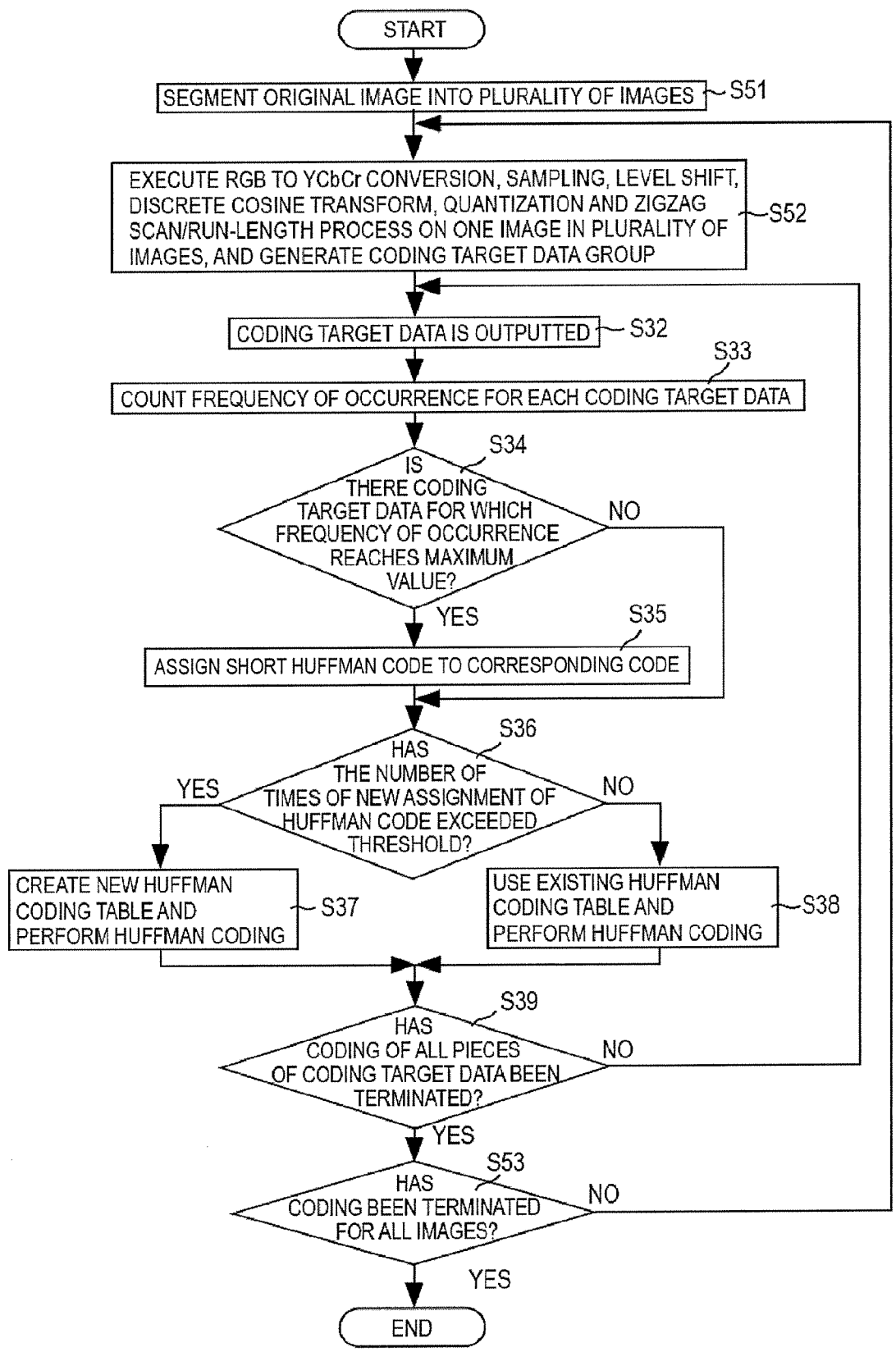
FIG. 24 is a flowchart for explaining another compression processing method in Embodiment 3.

FIG. 24 is a flowchart for explaining another compression processing method in Embodiment 3. In the flowchart shown in FIG. 24, steps S51 to S53 have been added to steps S32 to S39 of the flowchart shown in FIG. 18, and others are the same as the flowchart shown in FIG. 18.

With reference to FIG. 24, when a series of operations are started, the above described steps S51 and S52 are sequentially executed, and then the above described steps S32 to S39 are sequentially executed. In step S39, if it is determined that the coding of all of the coding target data has been terminated, the above described step S53 is executed, and in step S53, if it is determined that the coding has been terminated for all of the images, the series of operations are terminated.

As described above, Embodiment 3 is characterized in that the original image is segmented into the plurality of images with a focus on the target objects, and for each of the segmented plurality of images, the original image data is compressed by using the compression processing method according to Embodiment 1 or the compression processing method according to Embodiment 2.

Since the segmentation of the original image is performed so that each target object is extracted, each segmented image consists of similar image data. Therefore, the data compression can be flexibly performed by applying the Huffman coding according to Embodiments 1 and 2 to these respective images.

For example, the landscape picture shown in FIG. 5 is segmented into three images of an image consisting of the sky, an image consisting of the mountain, and an image consisting of the ground. As a result, since each image in the three images consists of symbol sequences having similar frequencies of occurrence, the Huffman coding table which flexibly addresses each image can be created. Therefore, the data compression can be flexibly performed.

It should be noted that, in the above description, it has been described that the image segmentation is performed by using the region growing type image segmentation method, which, however, is not limited thereto in the present invention, and the image segmentation may be performed by using methods described in (1) to (4) as follows.

(1) B. Jaehne, "Digital Image Processing 5th revised and extended edition," Springer-Verlag, pp. 427-440, 2001.

(2) J. C. Russ, "The Image Processing Handbook," CRC PRESS, pp. 371-429, 1999.36

(3) T. Braeunl, S. Feyrer, W. Rapf, and M. Reinhardt, "Parallel Image Processing," Springer-Verlag, 2000.

(4) W. Y. Ma, and B. S. Manjunath, "Edgeflow: a technique for boundary detection and segmentation," IEEE Transactions on Image Processing, vol. 9 (8), pp. 1375-1388, 2004.

Others are the same as Embodiments 1 and 2.

In the above described Embodiments 1 to 3, the case of compressing the image data has been described, which, however, is not limited thereto in the present invention, and the compression processing apparatus and the compression processing method according to the present invention may compress text data and audio data by the above described methods.

The embodiments disclosed this time should be considered as an exemplification in all regards, and not as limitative. It is intended that the scope of the present invention is shown by the claims, not by the descriptions of the above described embodiments, and all changes within the meaning and scope equivalent to the claims are included therein.

INDUSTRIAL APPLICABILITY

The present invention is applied to a compression processing apparatus which can improve compression efficiency. Moreover, the present invention is applied to a compression processing method which can improve the compression efficiency.

The invention claimed is:

1. A compression processing apparatus compressing input data and outputting compressed data, comprising:
    a dividing unit dividing a plurality of elements included in a population having said input data into a plurality of subsets by using a feature of each element;
    a coding unit performing Huffman coding on coding target data for each subset by using a plurality of Huffman coding tables provided corresponding to said plurality of subsets, and outputting said compressed data;
    a table retaining unit retaining first and second coding tables each having a plurality of Huffman codes; and
    an updating unit updating one coding table which is not used for the Huffman coding on said input data, in said first and second coding tables, depending on a frequency of occurrence of said coding target data so that the coding target data with a highest frequency of occurrence is converted into a shortest Huffman code,
    wherein when a compression ratio of said compressed data is equal to or less than a threshold, said coding unit performs the Huffman coding on said coding target data for said each subset while creating said plurality of Huffman coding tables, based on the other coding table in said first and second coding tables, and when said compression ratio becomes larger than said threshold, said coding unit performs the Huffman coding on said coding target data for said each subset while creating said plurality of Huffman coding tables, based on the one coding table updated by said updating unit.

2. The compression processing apparatus according to claim 1, further comprising a table creating unit creating said plurality of Huffman coding tables by executing, for all of said plurality of subsets, a process for examining a frequency of occurrence of the coding target data included in one subset and creating the Huffman coding table corresponding to said one subset.

3. The compression processing apparatus according to claim 1, wherein said updating unit counts the frequency of occurrence for all of the coding target data, updates said one coding table by executing a process for, each time the frequency of occurrence for one of the coding target data reaches a maximum value, assigning a new Huffman code having a shorter length to said one of the coding target data for which said frequency of occurrence has reached said maximum value earlier in order thereof, for said all of the coding target data.

4. The compression processing apparatus according to claim 3, wherein said updating unit calculates said compression ratio based on the compressed data outputted from said coding unit, and, when the calculated compression ratio has become larger than said threshold, or when said new Huffman code has been assigned to said all of the coding target data, said updating unit generates an exchanging signal for exchanging said coding table and outputs the exchanging signal to said coding unit, and
    said coding unit exchanges said coding table in response to said exchanging signal, and performs the Huffman coding on said coding target data for said each subset while creating said plurality of Huffman coding tables, based on the exchanged coding table.

5. The compression processing apparatus according to claim 1, further comprising:
    an image segmenting unit segmenting an image into a plurality of images based on target objects included in said image and generating a plurality of input data,
    wherein said dividing unit executes a process dividing a plurality of elements included in a population having one of input data in said plurality of input data, into a plurality of subsets by using a feature of each element, for all of said plurality of input data, and
    said coding unit executes a process performing the Huffman coding on coding target data for each subset by using a plurality of Huffman coding tables provided corresponding to the plurality of subsets divided from said one of input data, and outputting said compressed data, for all of said plurality of input data.

6. A compression processing method compressing input data and outputting compressed data, comprising:
    a first step of a dividing unit dividing a plurality of elements included in a population having said input data into a plurality of subsets by using a feature of each element;
    a second step of a coding unit performing Huffman coding on coding target data for each subset by using a plurality of Huffman coding tables provided corresponding to said plurality of subsets, and outputting said compressed data; and
    a third step of an updating unit updating one coding table which is not used for the Huffman coding on said input data, in first and second coding tables each having a plurality of Huffman codes, depending on a frequency of occurrence of the coding target data so that the coding target data with a highest frequency of occurrence is converted into a shortest Huffman code,
    wherein, in said second step, when a compression ratio of said compressed data is equal to or less than a threshold, said coding unit performs the Huffman coding on said coding target data for said each subset while creating said plurality of Huffman coding tables, based on the other coding table in said first and second coding tables, and when said compression ratio becomes larger than said threshold, said coding unit performs the Huffman coding on said coding target data for said each subset while creating said plurality of Huffman coding tables, based on said one coding table.

7. The compression processing method according to claim 6, further comprising a fourth step of a table creating unit creating said plurality of Huffman coding tables by executing, for all of said plurality of subsets, a process examining a frequency of occurrence of the coding target data included in one subset and creating the Huffman coding table corresponding to said one subset.

8. The compression processing method according to claim 6, wherein said third step includes:
   a first substep of said updating unit counting the frequency of occurrence for all of the coding target data; and
   a second substep of said updating unit updating said one coding table by executing a process for, each time the frequency of occurrence for one of the coding target data reaches a maximum value, assigning a new Huffman code having a shorter length to said one of the coding target data for which said frequency of occurrence has reached said maximum value earlier in order thereof, for said all of the coding target data.

9. The compression processing method according to claim 8, wherein said third step further includes:
   a third substep of said updating unit calculating said compression ratio based on the compressed data outputted from said coding unit; and
   a fourth substep of, when the compression ratio calculated in said third substep has become larger than said threshold, or when said new Huffman code has been assigned to said all of the coding target data, said updating unit generating an exchanging signal for exchanging said coding table and outputting the exchanging signal to said coding unit, and
   in said second step, said coding unit exchanges said coding table in response to said exchanging signal, and performs the Huffman coding on said coding target data for said each subset while creating said plurality of Huffman coding tables, based on the exchanged coding table.

10. The compression processing method according to claim 6, further comprising:
   a fourth step of an image segmenting unit segmenting an image into a plurality of images based on target objects included in said image and generating a plurality of input data,
   wherein, in said first step, said dividing unit executes a process dividing a plurality of elements included in a population having one of input data in said plurality of input data, into a plurality of subsets by using a feature of each element, for all of said plurality of input data, and
   in said second step, said coding unit executes a process performing the Huffman coding on coding target data for each subset by using a plurality of Huffman coding tables provided corresponding to the plurality of subsets divided from said one of input data, and outputting said compressed data, for all of said plurality of input data.

* * * * *